US009646663B2

(12) United States Patent
Bu et al.

(10) Patent No.: US 9,646,663 B2
(45) Date of Patent: May 9, 2017

(54) MULTI-BANK MEMORY WITH LINE TRACKING LOOP

(71) Applicant: TAIWAN SEMICONDUCTOR MANUFACTURING COMPANY LTD., Hsinchu (TW)

(72) Inventors: Ming-En Bu, Shanghai (CN); Xiuli Yang, Shanghai (CN); He-Zhou Wan, Shanghai (CN); Mu-Jen Huang, Taipei (TW); Jie Cai, Shanghai (CN)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/751,820

(22) Filed: Jun. 26, 2015

(65) Prior Publication Data

US 2016/0358637 A1     Dec. 8, 2016

(30) Foreign Application Priority Data

Jun. 5, 2015 (CN) .......................... 2015 1 0307020

(51) Int. Cl.
*G11C 8/18* (2006.01)
*G11C 8/16* (2006.01)
*G11C 7/10* (2006.01)
*G11C 8/12* (2006.01)

(52) U.S. Cl.
CPC .............. *G11C 8/16* (2013.01); *G11C 7/1075* (2013.01); *G11C 8/12* (2013.01); *G11C 8/18* (2013.01)

(58) Field of Classification Search
CPC .................................... G11C 8/16; G11C 8/18
See application file for complete search history.

(56) References Cited

U.S. PATENT DOCUMENTS

| 6,831,853 B2* | 12/2004 | Lin .......................... G11C 7/08 365/154 |
| 2010/0214857 A1* | 8/2010 | Hsu .......................... G11C 8/04 365/191 |
| 2012/0206983 A1* | 8/2012 | Zhang ................... G11C 11/419 365/194 |
| 2013/0088926 A1* | 4/2013 | Tao ....................... G11C 11/419 365/189.05 |
| 2013/0208554 A1* | 8/2013 | Wang ....................... G11C 7/18 365/194 |
| 2014/0269026 A1* | 9/2014 | Tao ....................... G11C 11/419 365/156 |

* cited by examiner

*Primary Examiner* — Khamdan Alrobaie
(74) *Attorney, Agent, or Firm* — WPAT, P.C., Intellectual Property Attorneys; Anthony King; Kay Yang

(57) ABSTRACT

In some embodiments, a circuit comprises a plurality of memory banks, a column line tracking loop and/or a row line tracking loop, and a tracking circuit. The plurality of memory banks are arranged in a plurality of rows and a plurality of columns of memory building blocks. The column line tracking loop traverses at least a portion of the plurality of rows. The row line tracking loop traverses at least a portion of the plurality of columns. The tracking circuit is configured to receive a first edge of a first signal, cause the first edge of a first signal to be propagated through the column line tracking loop and/or through the row line tracking loop and cause a second edge of the first signal when receiving the propagated first edge of the first signal. The first signal is associated with accessing of the plurality of memory banks.

11 Claims, 16 Drawing Sheets

MULTI-BANK MEMORY WITH LINE TRACKING LOOP

PRIORITY CLAIM AND CROSS-REFERENCE

This application claims priority to CN. application Ser. No. 201510307020.8 filed on 2015 Jun. 5, the disclosure of which is hereby incorporated by reference in its entirety.

BACKGROUND

By partitioning a flat memory into a hierarchical multi-bank memory, each memory bank of the multi-bank memory has, for example, localized and thereby shortened bit line pairs. Data to be applied to or received from a local bit line pair is transmitted through a global bit line pair across memory banks in a column. Due to a smaller loading of the global bit line pair compared to a bit line pair in the flat memory, a smaller access delay is incurred.

The multi-bank memory can be multi-port and allows multiple accessing operations per clock cycle, thereby increasing bandwidth of the multi-bank memory. To implement, for example, a dual-port memory bank, each memory cell can have an additional port added in addition to an existing read/write port. However, transistors and wires for implementing the additional port for each memory cell occupy additional area. Furthermore, a read-disturb-write situation or a write-disturb-write situation can arise, for example, when a write operation occurs at one port, and a dummy read operation resulted from a read operation or a write operation of another cell in the same row occurs at the other port simultaneously. In contrast, a dual-port memory bank can be implemented using single-port memory cells with the single port shared by two operations in a time division multiplexed manner. In this way, the area efficiency is higher and the read-disturb-write and write-disturb-write situations are prevented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
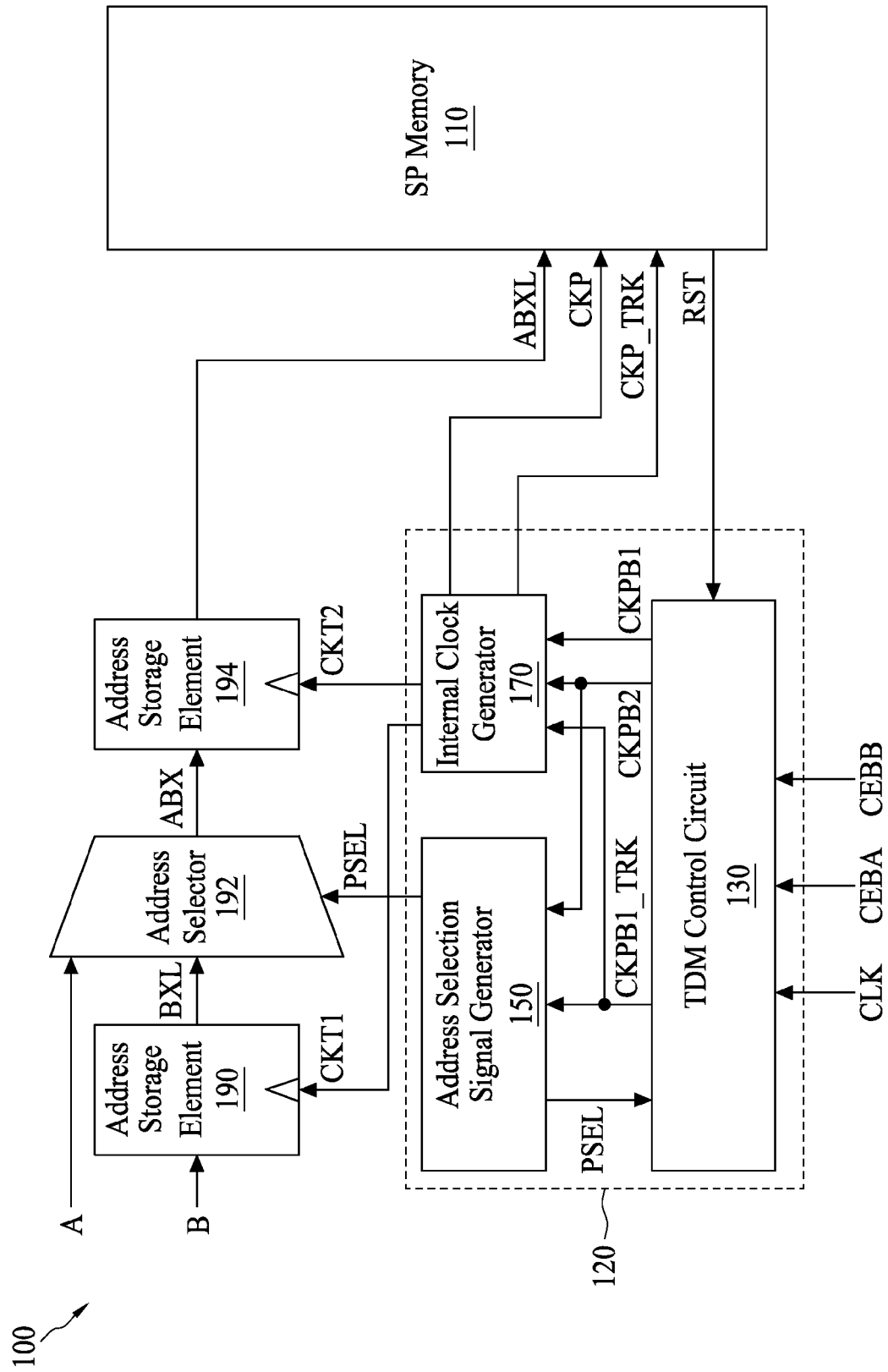
FIG. 1 is a schematic block diagram of a time division multiplexed dual-port (TDM DP) memory in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present. In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a schematic block diagram of a time division multiplexed dual-port (TDM DP) memory 100 in accordance with some embodiments. The TDM DP memory 100 includes a single-port (SP) memory 110, a TDM circuit 120, address storage elements 190 and 194, and an address selector 192.

The TDM circuit 120 is configured to receive an external clock signal CLK, an A port address available signal CEBA, a B port address available signal CEBB and a reset signal RST, and generate an internal clock signal CKP and an internal clock with track signal CKP_TRK for the SP memory 110. The external clock signal CLK is a clock signal of a system within which the TDM DP memory 100 operates. The A port address available signal CEBA indicates whether an accessing operation is to be performed at an A port address A in a clock cycle of the external clock signal CLK. The B port address available CEBB indicates whether an accessing operation is to be performed at a B port address B in the clock cycle. The internal clock signal CKP is a clock signal based on which the SP memory 110 operates in the time division multiplexed manner. The reset signal RST controls timing of one or more pulses in the internal clock signal CKP.

In the case when both the A port address available signal CEBA and the B port address available signal CEBB are asserted in the clock cycle, the internal clock signal CKP has a first pulse and a second pulse in the clock cycle and a first accessing operation is to be performed at an A port address A in the first pulse and a second accessing operation is to be performed at a B port address B in the second pulse. In the case when, for example, only the B port address available signal CEBB is asserted in the clock cycle, the internal clock signal CKP has only a second pulse in the clock cycle and only one accessing operation is to be performed at the B port address B in the second pulse. In the case when none of the A port address available signal CEBA and the B port address available signal CEBB is asserted, the internal clock signal CKP has no pulse. On the other hand, the internal clock with track signal CKP_TRK has two pulses within one clock cycle of the external clock signal CLK regardless whether both the A port address available signal CEBA and the B port address available signal CEBB are asserted or only the B port address available signal CEBB is asserted in the clock cycle. In the case when none of the A port address available signal CEBA and the B port address available signal CEBB is asserted, the internal clock with track signal CKP_TRK has no pulse. The internal clock with track signal CKP_TRK is used by the SP memory 110 to generate the reset signal RST to control the timing of the second pulse of the internal clock signal CKP to be the same regardless whether the A port address available signal CEBA is asserted in the clock cycle.

The TDM circuit 120 further generates an address selection signal PSEL and address storage element clock signals CKT1 and CKT2 to alternatively provide the A port address A and the B port address B as the address ABXL to the SP memory 110. In some embodiments, the address storage elements 190 and 194 are latches which pass through data when their corresponding clock signals are low, and latch data when their corresponding clock signals are high. The address storage element 190 is configured to latch or pass through the B port address B as the address BXL in response to the clock signal CKT1. The address selector 192 is configured to select the A port address A, and the address BXL from the address storage element 190 based on the address selection signal PSEL to generate a selected address ABX. The address storage element 194 is configured to latch the selected address ABX in response to the clock signal CKT2, and provide the address ABXL to the SP memory 110.

In some embodiments, the TDM circuit 120 includes a TDM control circuit 130, an address selection signal generator 150 and an internal clock generator 170. The TDM control circuit 130 is configured to receive the external clock signal CLK, the A port address available signal CEBA, the B port address available signal CEBB, the address selection signal PSEL and the reset signal RST and generates a pulse control signal CKPB1, a pulse control with track signal CKPB1_TRK and a pulse control signal CKPB2. The pulse control signal CKPB1 controls generation of the first pulse in the internal clock signal CKP. The pulse control with track signal CKPB1_TRK controls generation of the first pulse in the internal clock with track signal CKP_TRK. The pulse control signal CKPB2 controls generation of the second pulse in the internal clock signal CKP and the internal clock with track signal CKP_TRK. The internal clock generator 170 is configured to receive the pulse control signal CKPB1, the pulse control with track signal CKPB1_TRK and the pulse control signal CKPB2, and generate the internal clock signal CKP, the internal clock with track signal CKP_TRK and the address storage element clock signals CKT1 and CKT2. The address selection signal generator 150 is configured to receive the pulse control with track signal CKPB1_TRK and the pulse control signal CKPB2, and generate the address selection signal PSEL.

Figure 2:
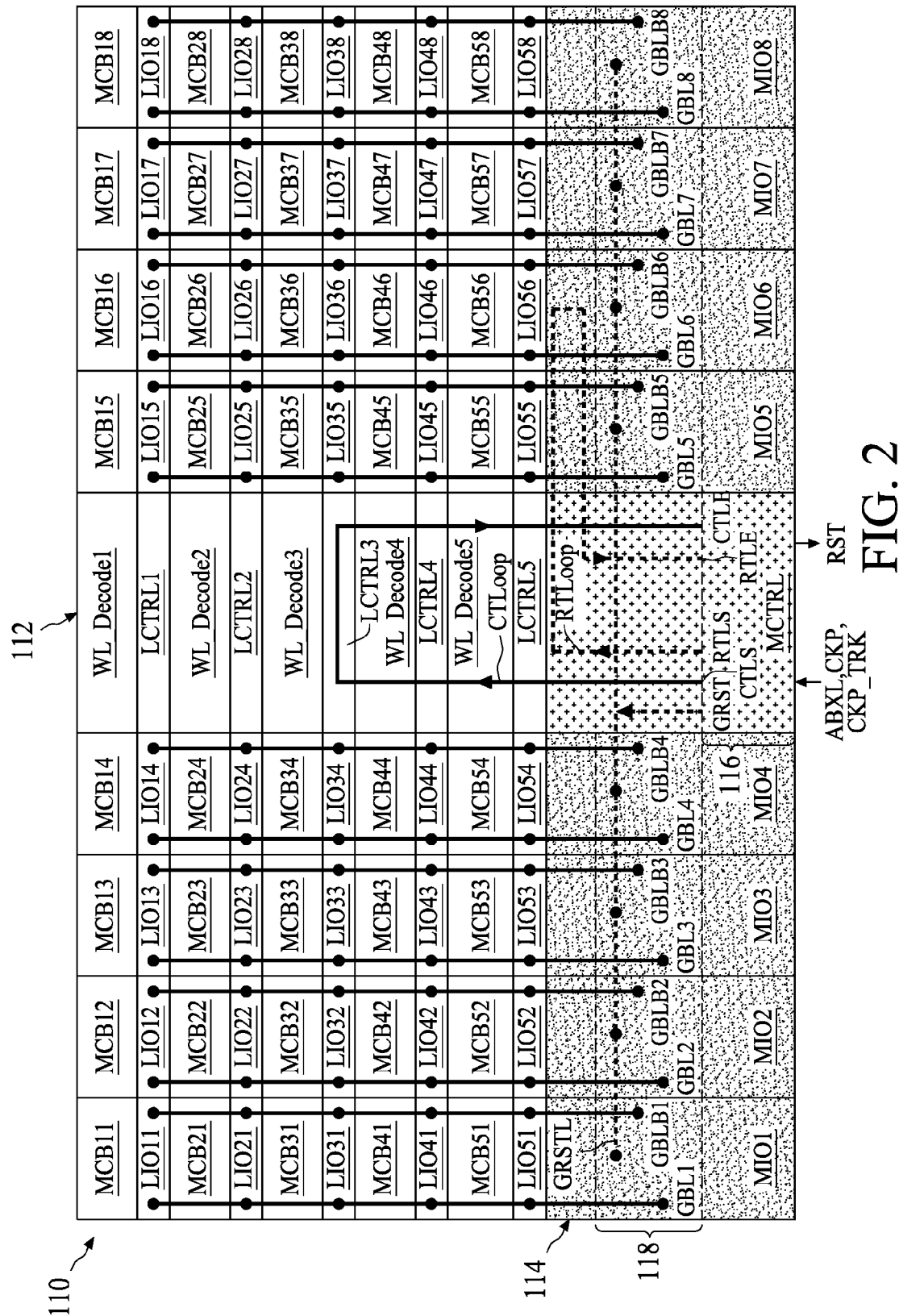
FIG. 2 is a schematic block diagram of a single-port (SP) memory in accordance with some embodiments.

FIG. 2 is a schematic block diagram of the SP memory 110 in accordance with some embodiments. The SP memory 110 includes a plurality of rows and a plurality of columns of memory building blocks. A plurality of memory banks MCB11, . . . and MCB 58 and associated circuitry are arranged in the plurality of rows and the plurality of columns. A first row of the plurality of rows includes a memory bank MCB11 and a local input and output (IO) block LIO11, . . . and a memory bank MCB14 and a local IO block LIO14, a wordline decoding block WL_Decode1 and a local control block LCTRL1, a memory bank MCB15 and a local IO block LIO15, . . . and a memory bank MCB18 and a local IO block LIO18. The second to fifth rows are constituted similarly as the first row. The sixth row includes a main IO block MIO1, . . . and a main IO block MIO4, a main control block MCTRL, a main IO block MIO5, . . . and a main IO block MIO8. A first column of the plurality of columns includes the memory bank MCB11 and the local IO block LIO11, . . . and the memory bank MCB51 and the local IO block LIO51, and the main IO block MIO1. The second to eighth columns are constituted similarly as the first column. A central column between the fourth column and the fifth column includes the wordline decoding block WL_Decode1 and the local control block LCTRL1, . . . and the wordline decoding block WL_Decode5 and the local control block LCTRL5, and the main control block MCTRL. The central column is also referred to as an accessing control column 112. The row containing the main control block MCTRL, the main IO block MIO1, . . . and the main IO block MIO8 is referred to as an accessing control row 114.

The local IO blocks LIO11 . . . and LIO51 and the main IO block MIO1 of the first column is coupled to a global bit line GBL1 and a complementary global bit line GBLB1 (referred to as global bit line pair GBL1 and GLBL1 hereafter) running vertically across the first row to the sixth row. Similarly, each of the second column, . . . and the eighth column has a global bit line pair GBL2 and GBLB2, . . . or GBL8 and GBLB8. The global bit line GBL1, . . . or GBL8 or the complementary global bit line GBLB1, . . . or GBLB8 is an example of a column line used herein. Before data sensing at one of the local IO blocks commences, the global bit line pair GBL1 and GBLB2, . . . and the global bit line pair GBL8 and GBLB8 are reset, i.e. pre-charged, so that data sensing based on differential voltages established in the global bit line pair GBL1 and GBLB2 . . . or the global bit line pair GBL8 and GBLB8 can be performed. Each global bit line pair GBL1 and GBLB1, . . . or GBL8 and GBLB8 is coupled to a global pre-charge unit 118 of the corresponding main IO block MIO1, . . . or MIO8. The global pre-charge units of the main IO blocks MIO1, . . . and MIO8 are coupled to a global bit line reset line GRSTL running horizontally across the first column to the eighth column. The global bit line reset line GRSTL receives a global bit line reset signal GRST from a reset signal generating unit 116 of the main control block MCTRL. The global bit line reset line is an example of a row line used herein.

In order to track a delay for the global bit line pairs GBL1 and GBLB1, . . . and GBL8 and GBLB8 to be pre-charged, a column line tracking loop CTLoop is configured in the accessing control column 112. The column line tracking loop CTLoop has a starting end CTLS and an ending end CTLE which are coupled to the reset signal generating unit 116. The column line tracking loop CTLoop traverses a plurality of rows. In the example in FIG. 2, the column line tracking loop CTLoop starts from the starting end CTLS, traverses the sixth row, the fifth row, the fourth row and the third row and then turns back from the third row to the ending end CTLE in the sixth row. In some embodiments, the column line tracking loop CTLoop has portions that are substantially in parallel to at least a portion of the global bit line GBL1, . . . or GBL8 or the complementary global bit line GBLB1, . . . or GBLB8. In addition, in order to track a delay for the global bit line reset signal GRST to be propagated in the global bit line reset line GRSTL to the pre-charge unit 118 of each column, a row line tracking loop RTLoop is configured in the accessing control row 114. The row line tracking loop RTLoop has a starting end RTLS and an ending end RTLE which are coupled to the reset signal generating unit 116 of the main control block MCTRL. The row line tracking loop RTLoop traverses a plurality of columns. In the example in FIG. 2, the row line tracking loop RTLoop starts from the starting end RTLS, traverses the center column, the fifth column, the sixth column and then turns back from the sixth column to the ending end RTLE in the center column. In some embodiments, the row line tracking loop RTLoop has portions that are substantially in parallel to at least a portion of the global bit line reset line GRSTL. The number of rows and the number of columns traversed are dependent on the corresponding delay to be tracked and are configurable as will be discussed with references to FIGS. 11-14.

The column line tracking loop CTLoop configured in another column of the SP memory 110, such as a column containing the memory banks (e.g. MCB14, . . . and MCB54), and the row line tracking loop RTLoop configured in another row of the SP memory 110, such as a row containing the memory banks (e.g. MCB51, . . . and MCB58) are within the contemplated scope of the present disclosure.

Each memory bank includes an array of SP memory cells and the array of SP memory cell includes at least one SP memory cell. In some embodiments, each SP memory cell is a 6T SRAM cell which includes a cross-coupled inverter pair and two access transistors. The cross-coupled inverter pair retains data at a storage node and a complementary storage node. The access transistors control passing of data from a bit line and a complementary bit line to the storage node and the complementary storage node in a write operation, and passing of data from the storage node and the complementary storage node to the bit line and the complementary bit line in a read operation in response to a signal at a wordline.

Each row of the five rows of memory banks MCB11 to MCB18, . . . and MCB51 to MCB58 has the associated wordline decoding block WL_Decode1, . . . or WL_Decode5 for accessing, for example, a row of memory cells in the respective row of memory banks MCB11 to MCB18, . . . or MCB51 to MCB58. Each memory bank MCB11, . . . or MCB58 has the respective local IO block LIO11, . . . or LIO58. Each row of the five rows of local IO blocks LIO11, . . . and LIO58 has the respective local control block LCTRL1, . . . or LCTRL5, and the row of main IO blocks MIO1, . . . and MIO8 has the main control block MCTRL for accessing, for example, one of the memory cells in the respective memory bank MCB11, . . . or MCB58. Each of the local IO blocks LIO11, . . . and LIO58 includes a local pre-charging unit, a local sense amplifier and a local data driver for each column of memory cells in the respective memory bank MCB11, . . . or MCB58 and further includes a local column decoding unit for the respective memory bank MCB11, . . . or MCB58. The local pre-charging unit is configured to pre-charge the bit line pair of the corresponding column of memory cells. The local sense amplifier is configured to sense data based on differential voltages received through the corresponding bit line pair during a read operation. The local data driver is configured to drive the corresponding bit line pair based on data to be written during a write operation. In some embodiments, the main IO block MIO1, . . . or MIO8 includes the global pre-charging unit 118, a global sense amplifier and a global data driver. The global pre-charge unit 118, as descried with reference to FIG. 1, is configured to pre-charge the global bit line pair GBL1 and GBLB1, . . . or GBL8 and GBLB8. The global sense amplifier is configured to sense data based on differential voltages received through the global bit line pair GBL1 and GBLB1, . . . or GBL8 and GBLB8 for the read operation. The global data driver is configured to drive the global bit line pair GBL1 and GBLB1, . . . or GBL8 and GBLB8 based on data to be written for the write operation.

The main control circuit MCTRL is configured to receive the address ABXL, the internal clock signal CKP, the internal clock with track signal CKP_TRK, and access, for example, one memory cell in a memory bank, e.g. MCB11. The main control circuit MCTRL identifies a bank address of the memory bank, e.g. MCB11, in the address ABXL, enables the corresponding wordline decoding block, e.g. WL_Decode1, the corresponding local control block, e.g. LCTRL1, and the corresponding local 10 block, e.g. LIO11, and sends pre-decoded row address, column address and internal clock signal CKP to the enabled wordline decoding block, e.g. WL_Decode1, and local control block, e.g. LCTRL1. The enabled wordline decoding block, e.g. WL_Decode1, receives the pre-decoded row address and the internal clock signal CKP and enables, for example, corresponding rows of memory cells in the memory banks, e.g. MCB11, . . . and MCB18, for access in response to the internal clock signal CKP. The enabled local control block, e.g. LCTRL1, receives the pre-decoded column address and selects several columns of cells to couple to the enabled LIO block (e.g. LIO11) and causes data to be sent to or received from one selected memory cell at one of the selected columns in the memory bank, e.g. MCB11, through the bit line pair of the memory cell. The main IO block, e.g. MIO1, of the selected column is also enabled in accordance with the bank address and causes data to be sent to or received from the global bit line pair, e.g. GBL1 and GBLB1, to the memory cell in the memory bank, e.g. MCB11.

Figure 3:
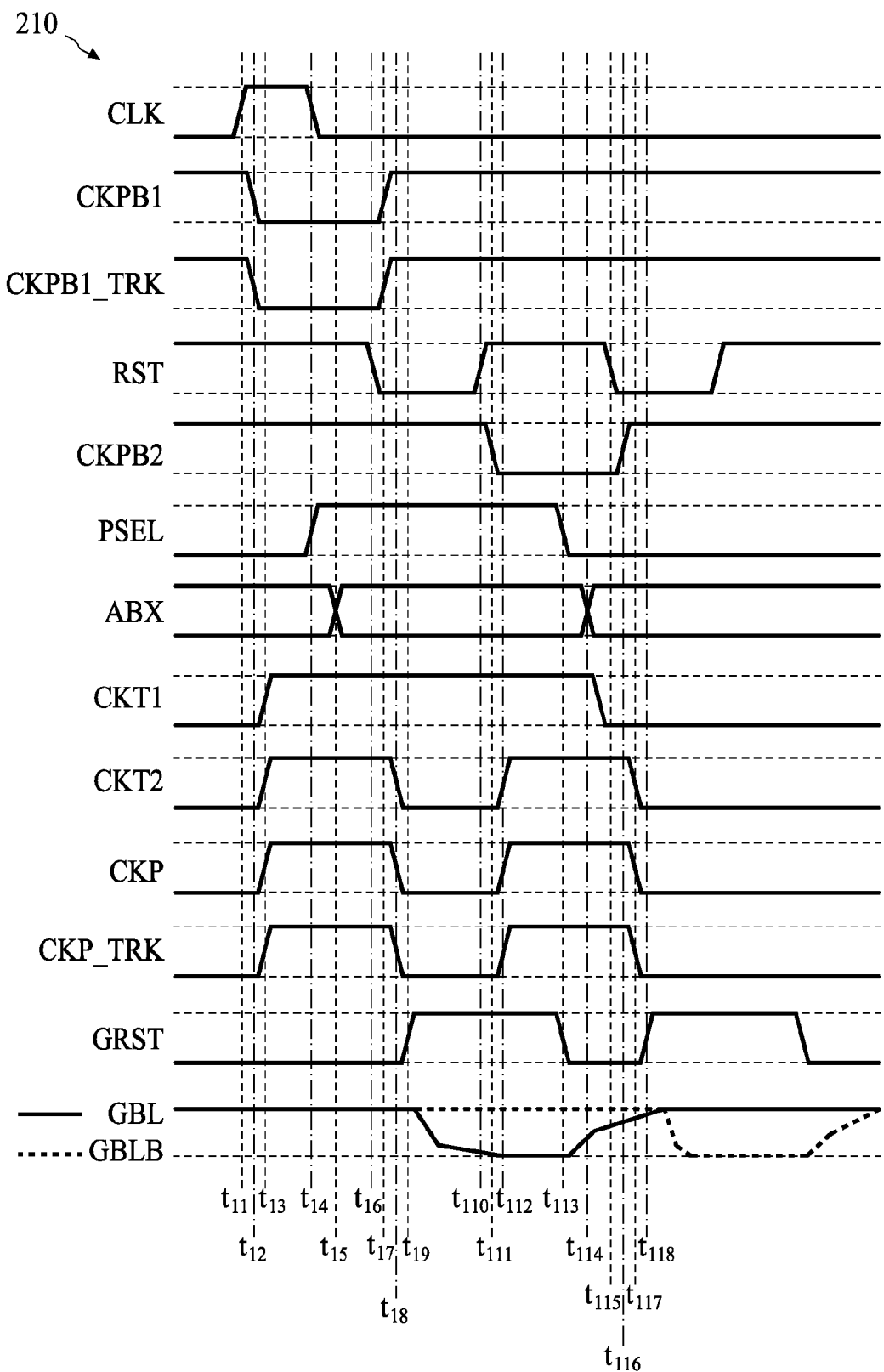
FIG. 3 is a schematic timing diagram illustrating operations of the TDM DP memory in accordance with some embodiments.

FIG. 3 is a schematic timing diagram 210 illustrating operations of the TDM DP memory 100 in accordance with some embodiments. Referring to FIGS. 1 to 3, FIG. 3 illustrates a clock cycle of the external clock signal CLK in which the internal clock signal CKP has a first pulse and a second pulse. A time period, also known as a guard band, between the first pulse and a second pulse is controlled by the reset signal RST of which a rising edge is delayed by the column line tracking loop CTLoop and the row line tracking loop RTLoop shown in FIG. 2. In the example in FIG. 3, the internal clock signal CKP and the internal clock with track signal CKP_TRK have the same waveforms.

At time $t_{l1}$, a rising edge of the external clock signal CLK arrives, and the clock cycle commences. The rising edge of the external clock signal CLK causes the TDM control circuit 130 to assert the pulse control signal CKPB1 and the pulse control with track signal CKPB1_TRK with a low value at time $t_{l2}$. The falling edge of the pulse control signal CKPB1 causes the internal clock generator 170 to generate a rising edge of the first pulse of the internal clock signal CKP and a rising edge of the clock signal CKT1 at time $t_{l3}$. The falling edge of the pulse control with track signal CKPB1_TRK causes the internal clock generator 170 to generate a rising edge of the first pulse of the internal clock with track signal CKP_TRK and a rising edge of the clock signal CKT2 at time $t_{l3}$. Before the rising edge of the first pulse of the internal clock with track signal CKP_TRK and similarly the internal clock signal CKP, the address selection signal PSEL has been low, and therefore the address selector 192 selects an A port address $A_1$ as the selected address ABX to the address storage element 194. Meanwhile, the clock signal CKT2 to the address storage element 194 has been low, and thus allows the address $A_1$ to pass through the address storage element 194 and be provided as the address ABXL to the main control block MCTRL of the SP memory 110 (shown in FIG. 2). The main control block MCTRL pre-decodes the address $A_1$ and awaits the rising edge of the internal clock signal CKP. At time $t_{l3}$, the rising edge of the first pulse of the internal clock signal CKP arrives, causing a first read or write operation on a memory cell at a current address, which is the address $A_1$, to commence. Also at time $t_{l3}$, for the address storage element 190, a B port address $B_1$ has been ready to be latched a setup time before the rising edge of the clock signal CKT1, and therefore, at time $t_{l3}$, the address storage element 190 latches the address $B_1$. For the address storage element 194, the address $A_1$ has been ready to be latched a setup time before the rising edge of the clock signal CKT2, and therefore at time $t_{l3}$, the address storage element 194 latches the address $A_1$.

The falling edge of the pulse control with track signal CKPB1_TRK at time $t_{l2}$ further causes the address selection signal generator 150 to pull up the address selection signal PSEL at time $t_{l4}$ which is between the rising edge of the first pulse of the internal clock signal CKP at time $t_{l3}$ and a falling edge of the first pulse to occur at time $t_{l8}$. The high value of the address selection signal PSEL causes the address selector 192 to select the address $B_1$ latched by the address storage element 190. At time $t_{l5}$, the address selector 192 provides a next address to be accessed, which is the address $B_1$, as the selected address ABX. Meanwhile, the address storage element 194 is still latched with the current address $A_1$ and therefore provides the current address $A_1$ to the SP memory 110 substantially throughout the first pulse of the internal clock signal CKP between time $t_{l3}$ and time $t_{l8}$.

After some delay with respect to the rising edge of the first pulse of the internal clock with track signal CKP_TRK at time $t_{l3}$, the main control circuit MCTRL asserts the reset signal RST with the low value at time $t_{l6}$. In some embodiments, the delay is determined in a self-timed manner by tracking a delay for traversing the path to access the memory cell at the current address $A_1$. In other embodiments, the delay is a fixed delay that is common to access of each of the memory cells in the SP memory 110.

The assertion of the reset signal RST at time $t_{l6}$ causes the TDM control circuit 130 to deassert the pulse control signal CKPB1 and the pulse control with track signal CKPB1_TRK with the high value at time $t_{l7}$. The deassertion of the pulse control signal CKPB1 at time $t_{l7}$ causes the internal clock generator 170 to generate the falling edge of the first pulse of the internal clock signal CKP at time $t_{l8}$. The deassertion of the pulse control with track signal CKPB1_TRK at time $t_{l7}$ causes the internal clock generator 170 to generate the falling edge of the first pulse of the internal clock with track signal CKP_TRK and a falling edge of the clock signal CKT2 at time $t_{l8}$. The falling edge of the first pulse of the internal clock signal CKP is received by the main control block MCTRL and ends accessing the memory cell at the address $A_1$. The rising edge of the first pulse of the internal clock signal CKP at time $t_{l3}$ further causes the delay for traversing the path to access the memory cell at the address $A_1$ to be tracked which in turn causes the global bit line reset signal GRST to be deasserted with the high value at time $t_{l9}$ and therefore enables the global bit line pair GBL and GBLB (which can be any of the GBL1 and GBLB1, . . . and GBL8 and GBLB8) to have differential voltages that can be sensed or to be driven with different values before the global bit line reset signal GRST is asserted with the low value at time $t_{l13}$ when the first read or write operation is ended.

The falling edge of the first pulse of the internal clock with track signal CKP_TRK at time $t_{l8}$ is further sent by the reset signal generating unit 116 of the main control block MCTRL to the column line tracking loop CTLoop and the row line tracking loop RTLoop, propagate in the column line tracking loop CTLoop and the row line tracking loop RTLoop and then back to the reset signal generating unit 116. Upon receiving the later of the looped back falling edges of the first pulses of the internal clock with track signal CKP_TRK from the column line tracking loop CTLoop and the row line tracking loop RTLoop, the reset signal generating unit 116 deasserts the reset signal RST with the high value at time $t_{l10}$.

The address selection signal PSEL at the high state enables the arrival of the rising edge of the reset signal RST to cause the TDM control circuit 130 to assert the pulse control signal CKPB2 with the low value at time $t_{l11}$. Before assertion of the pulse control signal CKPB2 at time $t_{l11}$, the falling edge of the clock signal CKT2 at time $t_{l8}$ causes the address storage element 194 to allow the selected address ABX which is the address $B_1$ at the time to pass through and provided as the address ABXL to the main control circuit MCTRL. Upon receiving the address $B_1$, the main control circuit MCTRL pre-decodes the address $B_1$ and awaits a rising edge of the second pulse of the internal clock signal CKP. The assertion of the pulse control signal CKPB2 at time $t_{l11}$ causes the internal clock generator 170 to generate the rising edge of the second pulse of the internal clock signal CKP, a rising edge of the second pulse of the internal clock with track signal CKP_TRK and a rising edge of the clock signal CKT2 at time $t_{l12}$. The rising edge of the second pulse of the internal clock signal CKP at time $t_{l12}$ causes a second read or write operation on a memory cell at a current address, which is at the address $B_1$ at the time, to commence. The rising edge of the clock signal CKT2 at time $t_{112}$ causes the address storage element 194 to latch the current address $B_1$.

After some delay with respect to the rising edge of the global bit line reset signal GRST at time $t_{19}$, the main control circuit MCTRL asserts the global bit line reset signal GRST with the low value at time $t_{113}$. In some embodiments, the delay is determined based on time during which a local sense amplifier in the LIO block enabled in accordance with the address $A_1$ is enabled. The delay encompasses time for enabling the local sense amplifier of the LIO block at a near-end or a far-end of the of the local control block LCTRL. After the delay, the global bit line reset signal GRST is asserted at time $t_{113}$ which causes the pre-charge unit 118 of each main IO block MIO to pre-charge the global bit line pair GBL and GBLB, i.e. to restore both values of the global bit line pair GBL and GBLB to high. After some delay with respect to the rising edge of the second pulse of the internal clock signal CKP_TRK at time $t_{112}$, the main control block MCTRL asserts the reset signal RST with the low value at time $t_{115}$. The delay is determined similarly as for the first pulse of the internal clock signal CKP. The assertion of the reset signal RST at time $t_{115}$ causes the TDM control circuit 130 to deassert the pulse control signal CKPB2 with the high value at time $t_{116}$. The deassertion of the pulse control signal CKPB2 at time $t_{116}$ causes the internal clock generator 170 to generate a falling edge of the second pulse of the internal clock signal CKP, a falling edge of the second pulse of the internal clock with track signal CKP_TRK and a falling edge of the clock signal CKT2 at time $t_{117}$. The falling edge of the second pulse of the internal clock signal CKP is received by the main control block MCTRL and ends accessing the memory cell at the address $B_1$. Similar to the first read or write operation, the rising edge of the second pulse of the internal clock signal CKP at time $t_{112}$ further causes the delay for traversing the path to access the memory cell at the address $B_1$ to be tracked which in turn causes the global bit line reset signal GRST to be deasserted with the high value at time $t_{118}$ and therefore enables the global bit line pair GBL and GBLB (which can be any of the GBL1 and GBLB1, . . . and GBL8 and GBLB8) to have differential voltages that can be sensed or to be driven with different values before the next assertion of the global bit line reset signal GRST when the second read or write operation is ended.

The falling edge of the pulse control signal CKPB2 at time $t_{111}$ causes the address selection signal generator 150 to pull down the address selection signal PSEL at time $t_{113}$ which is during the second pulse of the internal clock with track signal CKP_TRK. The low value of the address selection signal PSEL causes the address selector 192 to select an A port address $A_2$ and provide it as the selected address ABX at time $t_{114}$. The falling edge of the clock signal CKT2 at time $t_{116}$ causes the address storage element 194 to allow the selected address ABX, which is the address $A_2$ at the time to pass through and provided as the address ABXL to the main control circuit MCTRL. The address $A_2$ is processed similarly as the addresses $A_1$ by the main control circuit 112 in the next clock cycle.

Figure 4:
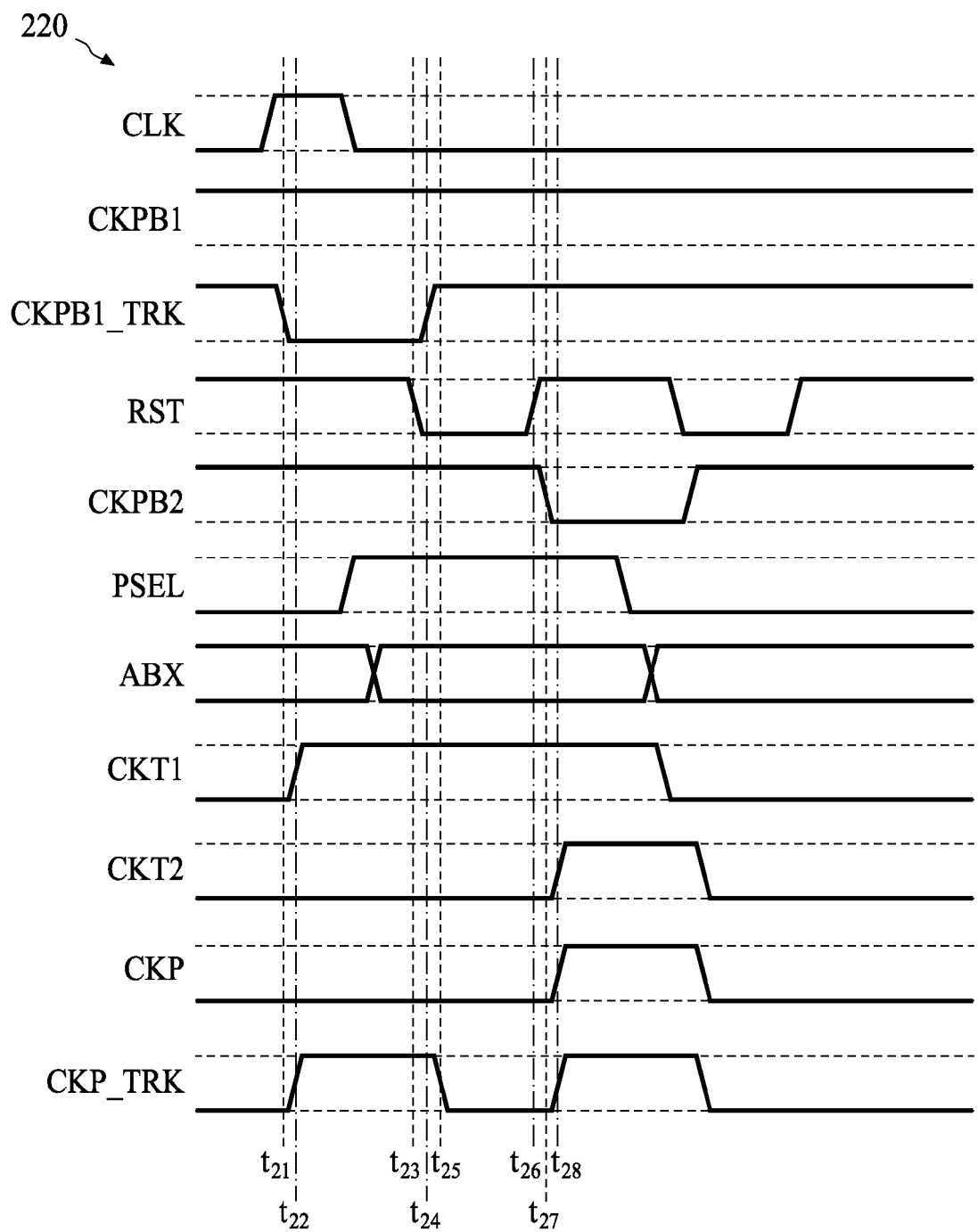
FIG. 4 is a schematic timing diagram illustrating other operations of the TDM DP memory in accordance with some embodiments.

FIG. 4 is a schematic timing diagram 220 illustrating other operations of the TDM DP memory 100 in accordance with some embodiments. Referring to FIGS. 1, 2 and 4, FIG. 4 illustrates a clock cycle of the external clock signal CLK in which the internal clock signal CKP only has a second pulse. Timing of the second pulse of the internal clock signal CKP is in synchronization with a second pulse of the internal clock with track signal CKP_TRK which has a first pulse and a second pulse in the clock cycle. The guard band between the first pulse and the second pulse of the internal clock with track signal CKP_TRK is controlled by the reset signal RST of which a rising edge is delayed by the column line tracking loop CTLoop and the row line tracking loop RTLoop shown in FIG. 2.

Compared to the timing diagram 210 in FIG. 3, the pulse control signal CKPB1 is not asserted during the clock cycle, and therefore a first pulse of the internal clock signal CKP is not generated. In contrast, the pulse control with track signal CKPB1_TRK is asserted with the low value at time $t_{21}$ and thereby causes a rising edge of the first pulse of the internal clock with track signal CKP_TRK to arrive at time $t_{22}$. After some delay with respect to the rising edge of the first pulse of the internal clock with track signal CKP_TRK, the reset signal RST is asserted with the low value at time $t_{23}$ and thereby causes the pulse control with track signal CKPB1_TRK to be deasserted with the high value at time $t_{24}$. The deassertion of the pulse control with track signal CKPB1_TRK at time $t_{24}$ causes a falling edge of the internal clock with track signal CKP_TRK at time $t_{25}$. The falling edge of the first pulse of the internal clock with track signal CKP_TRK at time $t_{25}$ is delayed by one of the column line tracking loop CTLoop and the row line tracking loop RTLoop that has the longer delay. Upon receiving the delayed falling edge of the first pulse of the internal clock with track signal CKP_TRK, the reset signal generating unit 116 deasserts the reset signal RST with the high value at time $t_{26}$. The deassertion of the reset signal RST at time $t_{26}$ causes the pulse control signal CKPB2 to assert with the low value at time $t_{27}$ which in turn causes the second pulse to be generated in the internal clock signal CKP and the internal clock with track signal CKP_TRK.

Figure 5:
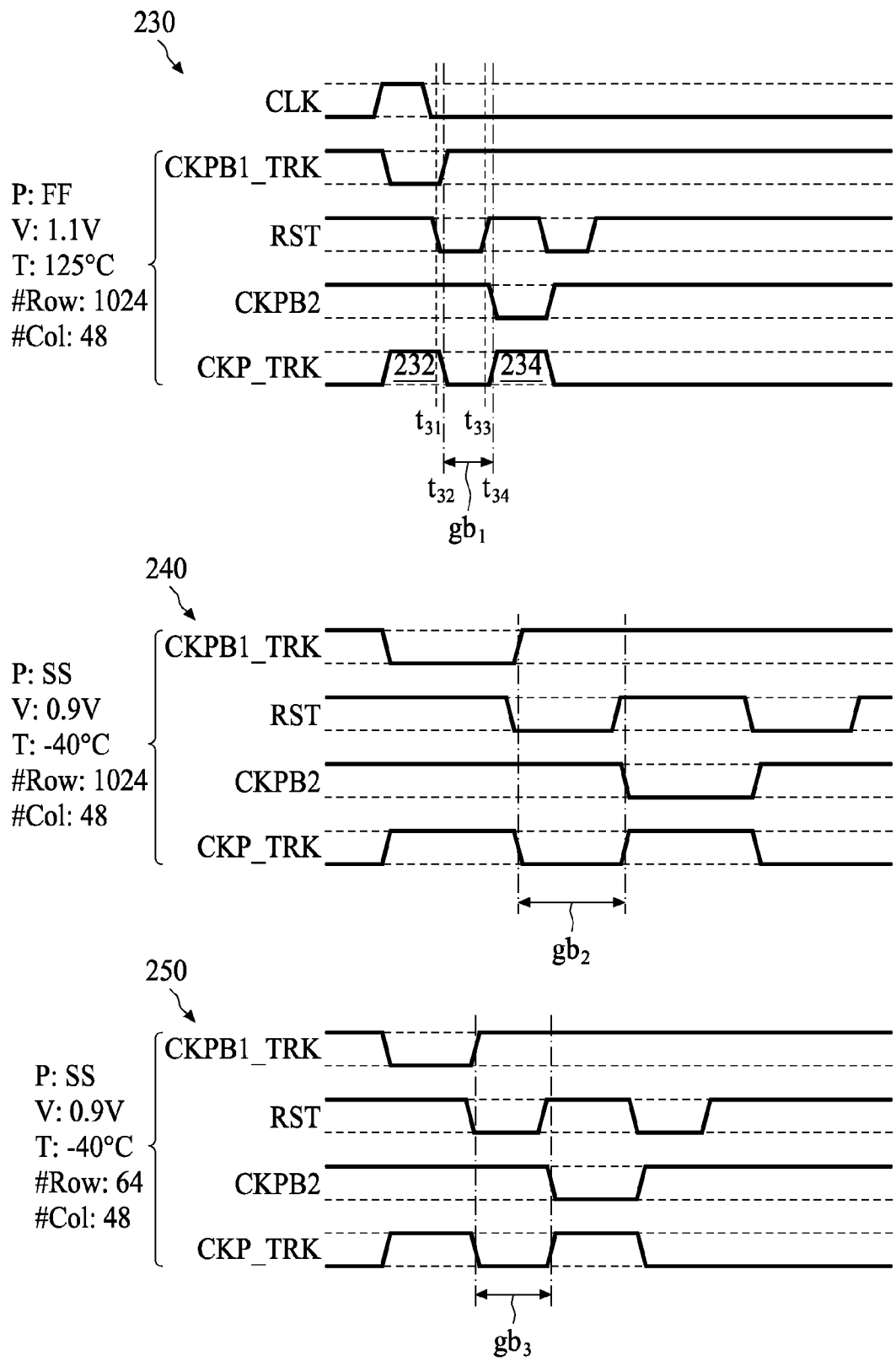
FIG. 5 illustrates schematic timing diagrams of the TDM DP memory under different process, voltage and temperature (PVT) conditions and different memory sizes in accordance with some embodiments.

FIG. 5 illustrates schematic timing diagrams of the TDM DP memory 100 under different process, voltage and temperature (PVT) conditions and different memory sizes in accordance with some embodiments. The timing diagram 230 illustrates waveforms of the internal clock with track signal CKP_TRK and the control signals CKPB1_TRK, RST and CKPB2 thereof within one clock cycle of the external clock signal CLK. The timing diagram 230 are generated under a fast-fast (FF) process corner, a voltage of 1.1V, a temperature of 125° C., a number of rows of 1024 rows, and a number of columns of 48 columns, i.e., 4096 words and 12 bits for each word. In the timing diagram 230, the internal clock with track signal CKP_TRK has the first pulse 232 and the second pulse 234. The guard band $gb_1$ between the first pulse 232 and the second pulse 234 is generated as follows. At time $t_{31}$, the reset signal RST is asserted with the low value which causes a rising edge of the pulse control with track CKBP1_TRK and therefore a falling edge of the first pulse 232 of the internal clock with track signal CKP_TRK to arrive at time $t_{32}$. The falling edge of the internal clock with track signal CKP_TRK is sent to and propagated through the column line tracking loop CLTLoop and the row line tracking loop RLTLoop separately. Upon receiving the later of the looped back falling edges of the internal clock with track signal CKP_TRK, the reset signal is deasserted with the high value at time $t_{33}$ which causes a falling edge of the pulse control signal CKPB2 and therefore the rising edge of the second pulse 234 of the internal clock with track signal CKP_TRK to arrive at time $t_{34}$. The guard band $gb_1$ exists between the falling edge of the first pulse 232 at time $t_{32}$ and the rising edge of the second pulse 234 at time $t_{34}$.

The guard bands $gb_2$ and $gb_3$ in the timing diagrams 240 and 250, respectively, are generated similarly as the guard band $gb_1$ in the timing diagram 230, except that the timing diagram 240 illustrates the guard band $gb_2$ generated under a slow-slow (SS) process corner, a voltage of 0.9V, a temperature of −40° C., a number of rows of 1024 rows and a number of columns of 48 columns. The timing diagram 250 illustrates the guard band $gb_3$ generated under an SS process corner, a voltage of 0.9V, a temperature of −40° C., a number of rows of 64 rows, and a number of columns of 48 columns, i.e. a word depth of 256 words and a word width of 12 bits.

In some embodiments, the column line tracking loop CLTLoop and the row line tracking loop RTLoop are made of conductive lines that track the RC delay for the global bit line pair (e.g. GBL5 and GBLB5) across the five rows to be restored and the RC delay for the global bit line reset line GRSTL across the eight columns to be asserted. By comparing the timing diagrams 230 and 240, it can be shown that the RC delays of the column line tracking loop CLTLoop and the row line tracking loop RLTLoop and therefore the guard bands $gb_1$ and $gb_2$ are dependent on the process, voltage and temperature variations. The guard band $gb_1$ under the FF process corner, the voltage of 1.1V, and temperature of 125° C. is smaller than the guard band $gb_2$ under the SS process corner, the voltage of 0.9V and the temperature of −40° C. By comparing the timing diagrams 240 and 250, it can be shown that the RC delays of the column line tracking loop CLTLoop and the row line tracking loop RLTLoop and therefore the guard bands $gb_2$ and $gb_3$ are dependent on the number of rows, and number of columns. The guard band $gb_2$ for the SP memory 110 having the number of rows of 1024 rows, and the number of columns of 48 columns is larger than the guard band $gb_3$ for the SP memory 110 having the number of rows of 64 rows, and the number of columns of 48 columns.

Figure 6:
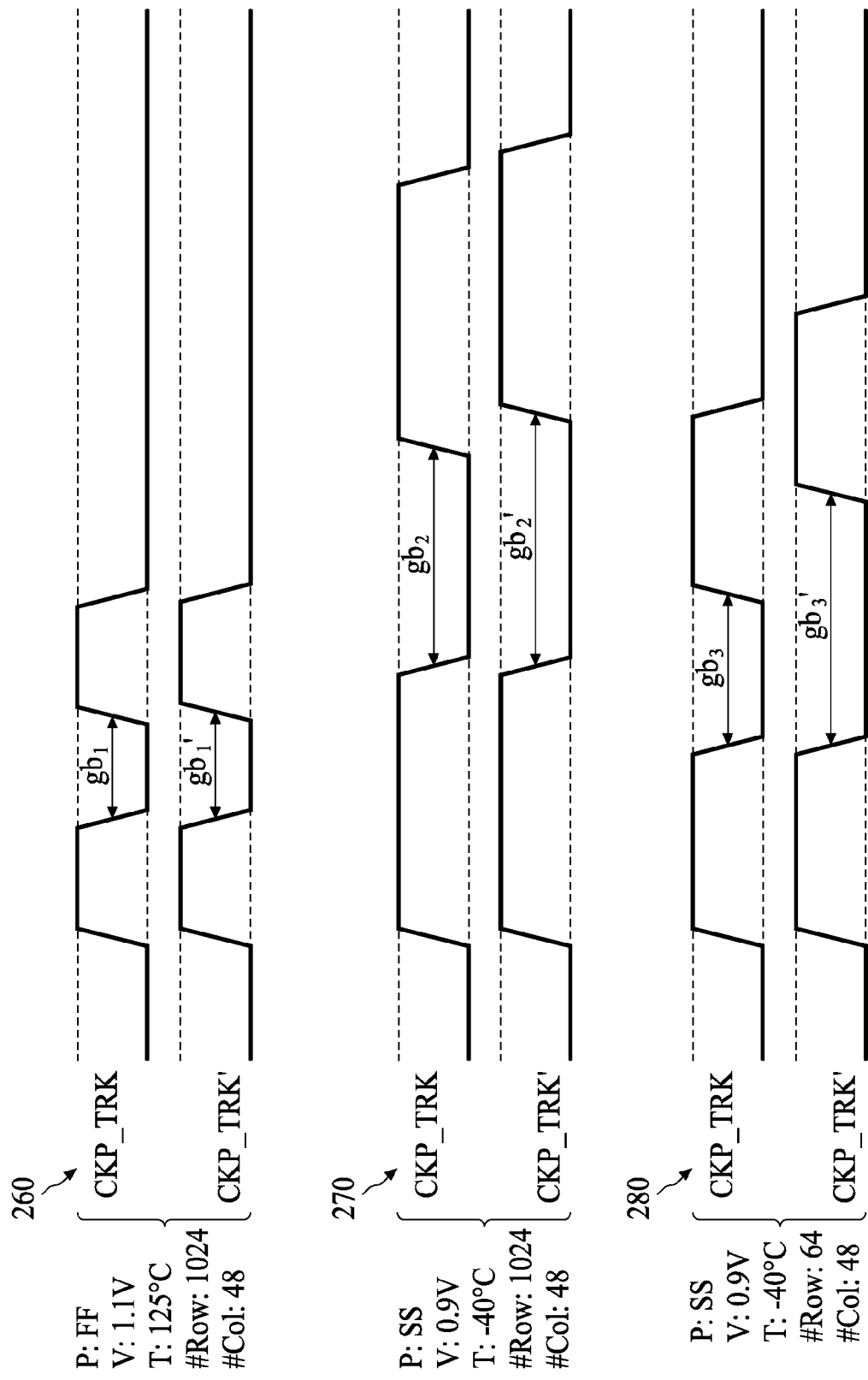
FIG. 6 illustrates comparison timing diagrams for comparing the TDM DP memory using the line tracking loops CLTLoop and RLTLoop to control the duration of the guard band, and a TDM MP memory using logic delay to control the duration of the guard band in accordance with some embodiments.

Referring to FIG. 2 and FIG. 6, FIG. 6 illustrates comparison timing diagrams 260, 270 and 280 for comparing the TDM DP memory 110 using the line tracking loops CLTLoop and RLTLoop to control the duration of the guard band, and a TDM DP memory using logic delay to control the duration of the guard band in accordance with some embodiments. The timing diagram 260 is generated under the FF process corner, the voltage of 1.1V, the temperature of 125° C., the number of rows of 1024 rows and the number of columns of 48 columns. The timing diagram 270 is generated under the SS process corner, the voltage of 0.9V, the temperature of −40° C., the number of rows of 1024 rows and the number of columns of 48 columns. The timing diagram 280 is generated under the SS process corner, the voltage of 0.9V, the temperature of −40° C., the number of rows of 64 rows and the number of columns of 48 columns. In each of the timing diagrams 260, 270 and 280, the internal clock with track signal CKP_TRK is generated by the TDM DP memory 100 which uses the line tracking loops CLTLoop and RLTLoop to control the duration of the guard band $gb_1$, $gb_2$ or $gb_3$. The internal clock with track signal CKP_TRK' is generated by the TDM DP memory using the logic delay to control the duration of the guard band $gb_1'$, $gb_2'$ or $gb_3'$.

The temperature has opposite effects with respect to logic gates and interconnect lines. For the logic gates, the higher the temperature is, the faster the speed of the circuit is. In contrast, for the interconnect lines, the higher the temperature is, the larger the RC delay is. Comparing the timing diagrams 260 and 270 which are under the temperature of 125° C. and the temperature of −40° C., respectively, the guard band $gb_1$ in the timing diagram 260 is compatible with the guard band $gb_1'$, and the guard band $gb_2$ in the timing diagram 270 is smaller than the guard band $gb_2'$. This is due to the fact that the decrease of RC delay due to decreasing of the temperature from 125° C. to −40° C. is accounted for by using the line tracking loops CLTLoop and RLTLoop to track the RC delays of the global bit line pairs (e.g. GBL5 and GBLB5) and the global bit line reset line GRSTL, respectively, but is oppositely accounted for by using the logic gates to create delay that cover the RC delays of the global bit line pairs (e.g. GBL5 and GBLB5) and the global bit line reset line GRSTL. Therefore, the performance of the TDM DP memory 100 (shown in FIG. 1) is significantly improved at the lower temperature.

In addition, the number of rows and number of columns also affect the RC delays of the global bit line pairs (e.g. GBL5 and GBLB5) and the global bit line reset line GRSTL. The larger the number of rows and/or the number of columns are, the longer the length of the global bit line pairs (e.g. GBL5 and GBLB5) and/or the length of the global bit line reset line GRSTL are, and therefore, the larger the RC delays of the global bit line pairs (e.g. GBL5 and GBLB5) and the global bit line reset line GRSTL. Comparing the timing diagrams 270 and 280 which are for the number of rows of 1024 rows and the number of rows of 64 rows, respectively, the guard band $gb_3$ of the timing diagram 280 is significantly smaller than the guard band $gb_2$ of the timing diagram 270 while the guard band $gb_3'$ of the timing diagram 280 is substantially the same as the guard band $gb_2'$ of the timing diagram 270. This is due to the fact that line segments of the column line tracking loop CLTLoop and the row line tracking loop RLTLoop are compiled in accordance with the number of rows and the number of columns, respectively, and therefore the RC delays of the line tracking loops CLTLoop or RLTLoop decrease with the decrease of the number of rows or number of columns. In contrast, the logic delay is fixed with respect to the different number of rows and number of columns. Therefore, the performance of the TDM DP memories 100 of the different sizes can be specifically optimized.

Figure 7:
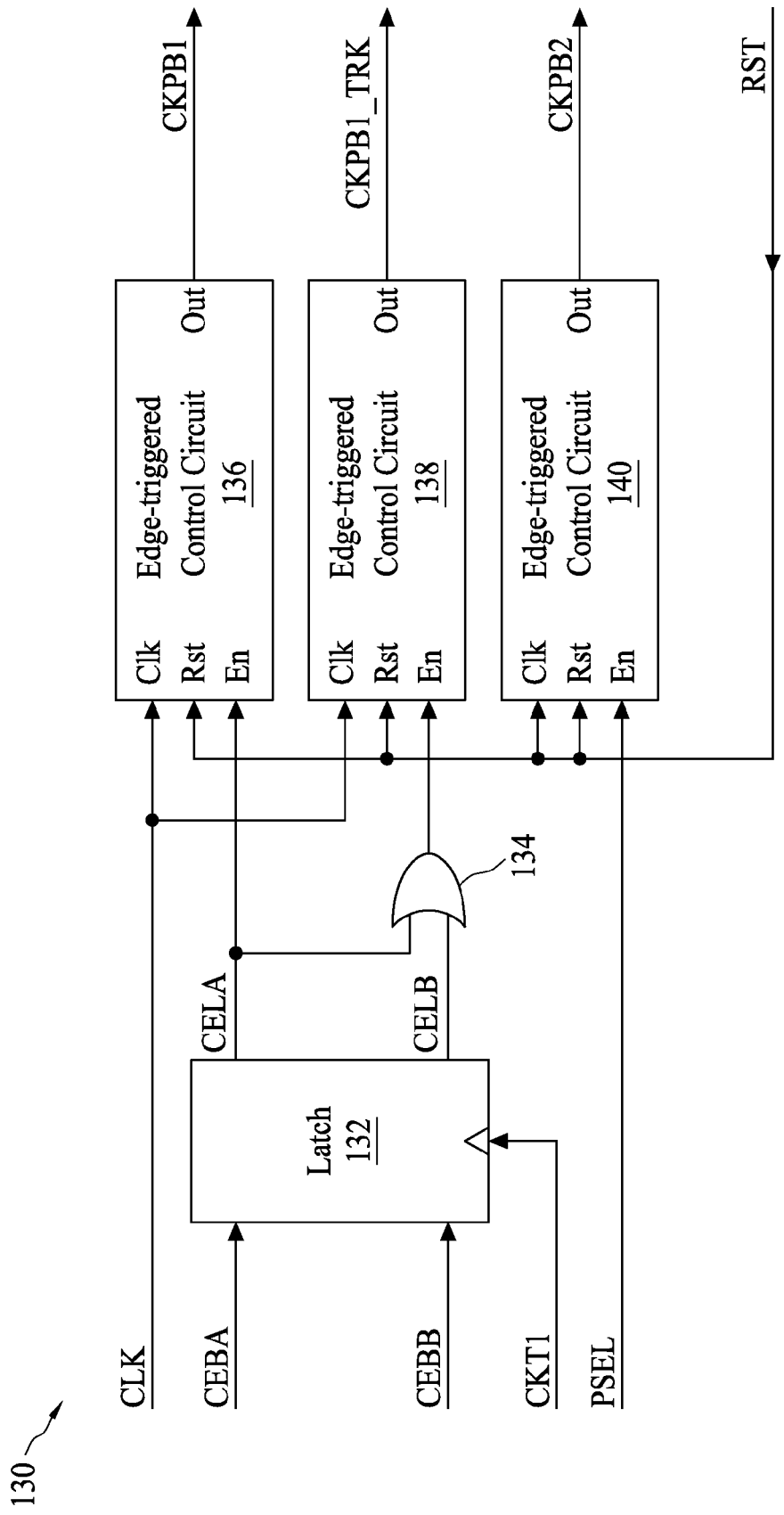
FIG. 7 is a schematic block diagram of the TDM control circuit in accordance with some embodiments.

FIG. 7 is a schematic block diagram of the TDM control circuit 130 in accordance with some embodiments. The TDM control circuit 130 includes edge-triggered control circuits 136, 138 and 140, and circuits for driving the inputs of the edge-triggered control circuits 136, 138 and 140 such as a latch 132 and an OR gate 134. The TDM control circuit 130 is configured to receive the external clock signal CLK, the address available signals CEBA and CEBB, the address storage element clock signal CKT1, the address selection signal PSEL and a reset signal RST, and generate a pulse control signal CKPB1, a pulse control with track signal CKPB1_TRK and a pulse control signal CKPB2.

In the TDM control circuit 130, the latch 132 receives the address available signals CEBA and CEBB and generates latched address available signals CELA and CELB based on the address storage element clock signal CKT1. Each of the edge-triggered control circuit 136, 138 and 140 are configured with a clock input pin Clk, a reset input pin Rst and an enable input pin En, and an output pin Out. Each of the edge-triggered control circuits 136, 138 and 140 is configured to assert a signal at its output pin Out when a signal to its enable input pin EN is enabled and a clock edge of a signal to its clock input pin Clk arrives, and deassert the signal at its output pin Out when a signal to its reset input pin Rst is asserted. The edge-triggered control circuit 136 receives the external clock signal CLK at its clock input pin Clk, the reset signal RST at its reset input pin Rst, and the latched address available signal CELA at its enable input pin En, and generates the pulse control signal CKPB1 at its output pin Out. Compared to the edge-triggered control circuit 136, the edge-triggered control circuit 138 receives an ORed result of the latched address available signals CELA and CELB from the OR gate 134 at its enable input pin En. Referring also to FIGS. 3 and 4, the pulse control signal CKPB1 is asserted when the latched address available signal CELA (not shown in FIGS. 3 and 4) is asserted with the high value and the rising edge of the external clock signal CLK arrives, and deasserted when the reset signal RST is asserted with the low value. In contrast, the pulse control with track signal CKPB1_TRK is asserted when either or both of the latched address available signals CELA and CELB are asserted, and the rising edge of the external clock signal CLK arrives.

In the TDM control circuit 130, the edge-triggered control circuit 140 receives the reset signal RST at its clock input pin Clk, the reset signal RST at its reset input pin Rst, and the address selection signal PSEL at its enable input pin En, and generates the pulse control signal CKPB2 at its output pin Out. Referring also to FIGS. 3 and 4, the pulse control signal CKPB2 is asserted when the address selection signal PSEL is at the high state which enables the edge-triggered control circuit 140 (i.e. the address selection signal PSEL causes the B port address B to be selected), and a rising edge of the reset signal RST arrives, and is deasserted when a falling edge of the reset signal RST arrives. As described with reference to FIG. 3, the falling edge, i.e. the assertion, of the reset signal RST is generated after tracked delay for accessing the memory cell at the current address. The rising edge, i.e. the deassertion of the reset signal RST is generated after tracked delays for propagating the global bit line reset signal GRST in the global bit line reset line GRSTL and resetting the global bit line pair (e.g. GBL5 and GBLB5).

Figure 8:
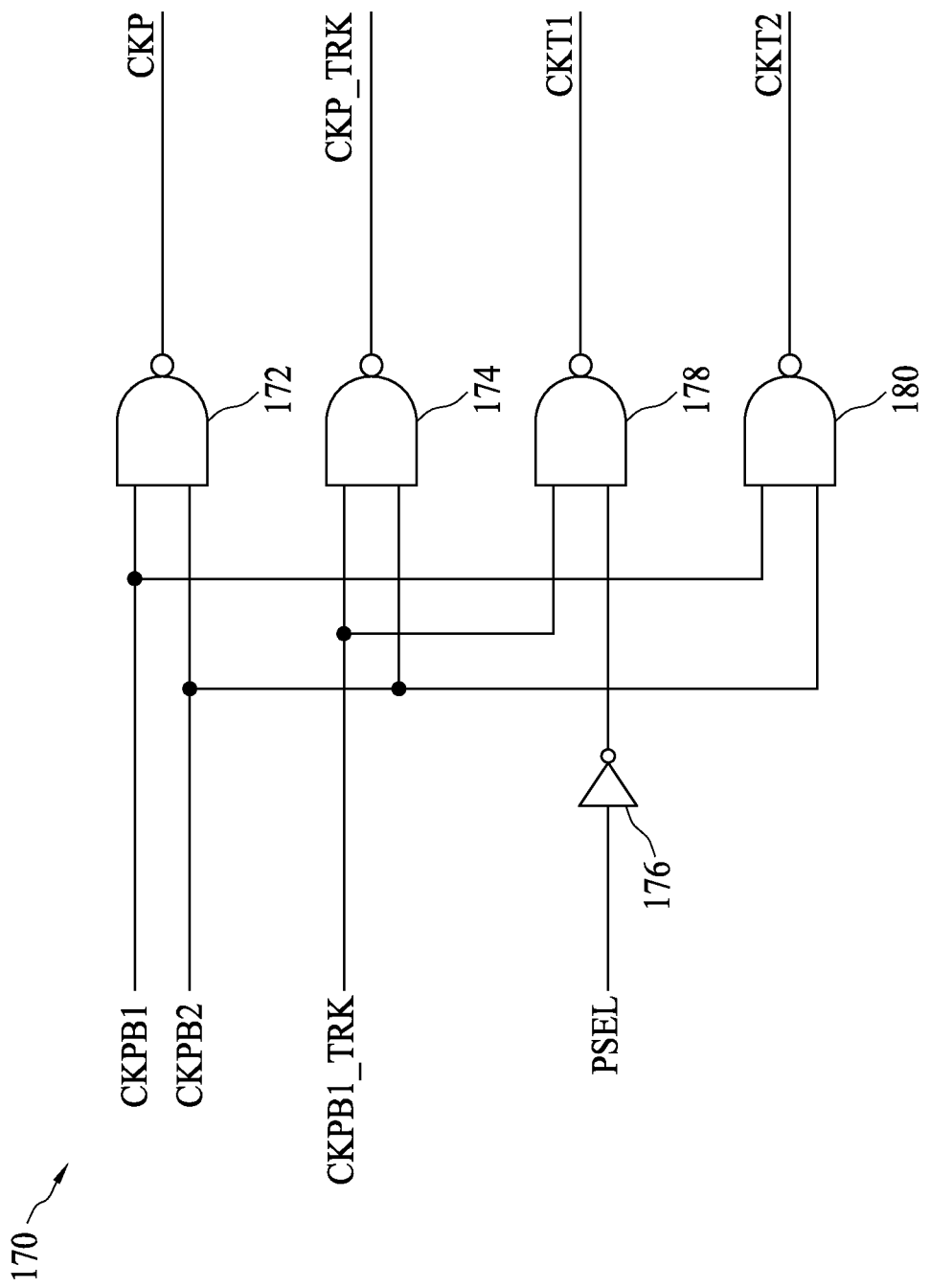
FIG. 8 is a schematic circuit diagram of the internal clock generator in accordance with some embodiments.

FIG. 8 is a schematic circuit diagram of the internal clock generator 170 in accordance with some embodiments. The internal clock generator 170 includes NAND gates 172, 174, 178 and 180, and an inverter 176. The NAND gate 172 receives the pulse control signals CKPB1 and CKPB2, and generates the internal clock signal CKP. The NAND gate 174 receives the pulse control with track signal CKPB1_TRK and the pulse control signal CKPB2, and generates the internal clock with track signal CKP_TRK. The inverter 176 receives the address selection signal PSEL and generates an inverted address selection signal. The NAND gate 178 receives the pulse control with track signal CKPB1_TRK, and the inverted address selection signal, and generates the address storage element clock signal CKT1. The NAND gate 180 receives the pulse control signal CKPB1 and the pulse control signal CKPB2, and generates the address storage element clock signal CKT2.

Referring to FIGS. 3, 4 and 8, because the internal clock signal CKP is the NANDed result of the pulse control signals CKPB1 and CKPB2, when either the pulse control signal CKPB1 or the pulse control signal CKPB2 is asserted with the low value, the internal clock signal CKP is generating a pulse, and when both the pulse control signals CKPB1 and CKPB2 are deasserted, the internal clock signal CKP is not generating the pulse. For the internal clock with track signal CKP_TRK, when either the pulse control with track signal CKPB1_TRK or the pulse control signal CKPB2 is asserted with the low value, the internal clock with track signal CKP_TRK is generating a pulse, and when both the pulse control with track signal CKPB1_TRK and the pulse control signal CKPB2 are deasserted, the internal clock with track signal CKP_TRK is not generating the pulse.

Referring to FIGS. 3 and 8, the address storage element clock signal CKT1 is the NANDed result of the pulse control with track signal CKPB1_TRK and the inverted address selection signal. Therefore, the address storage element 190 in FIG. 1 is passing through data when the pulse control with track signal CKPB1_TRK is deasserted with the high value, and the address selection signal PSEL is in the low state. The address storage element 190 is latching data when either the pulse control with track signal CKPB1_TRK is asserted with the low value, or the address selection signal PSEL is in the high state.

Referring to FIGS. 3 and 8, the address storage element clock signal CKT2 is the NANDed result of the pulse control signal CKPB1, and the pulse control signal CKPB2. In some embodiments, the clock signal CKT2 is generated the same as the internal clock with track signal CKP_TRK. Therefore, the address storage element 194 in FIG. 1 is passing through data when both the pulse control signal CKPB1 and the pulse control signal CKPB2 are deasserted with the high value, and is latching data when either the pulse control signal CKPB1 or the pulse control signal CKPB2 is asserted with the low value.

Figure 9:
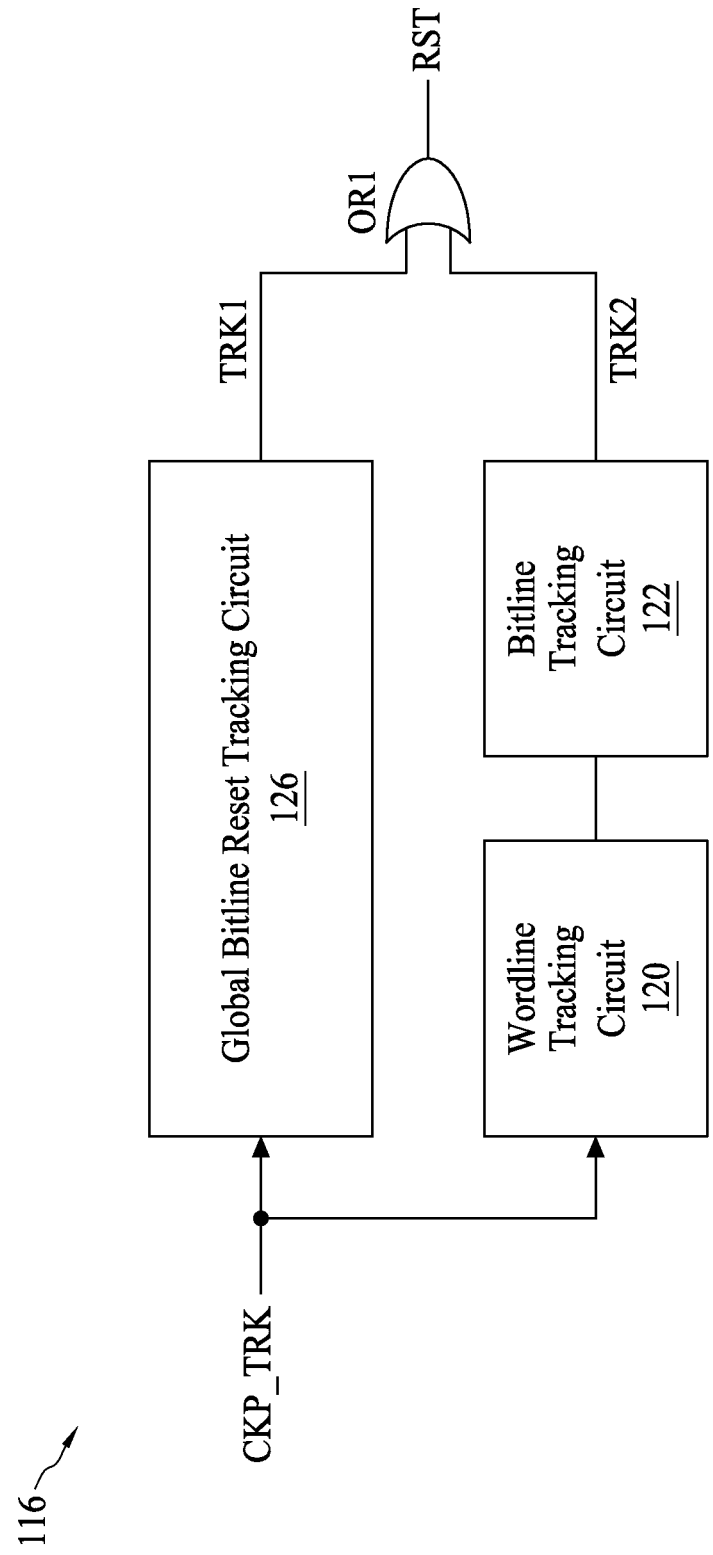
FIG. 9 is a schematic block diagram of the reset signal generating unit in the main control block in accordance with some embodiments.

FIG. 9 is a schematic block diagram of the reset signal generating unit 116 in the main control block MCTRL (shown in FIG. 2) in accordance with some embodiments. In some embodiments, the reset signal generating unit 116 includes a wordline tracking circuit 120, a bit line tracking circuit 122, a global bit line reset tracking circuit 126, and an OR gate OR1. A first input of the OR gate OR1 receives a track signal TRK1 generated by the global bit line reset tracking circuit 126. A second input of the OR gate OR1 receives a track signal TRK2 generated by the series-connected wordline tracking circuit 120 and bit line tracking circuit 122.

In some embodiments, the series-connected wordline tracking circuit 120 and the bitline tracking circuit 122 is configured to receive the internal clock with track signal CKP_TRK, traverse a dummy path that tracks an access delay from the rising edge of the internal clock with track signal CKP_TRK to data being written to the memory cell through the bit lines pairs or data at the memory cell being read out through the bit line pairs, and then assert its the track signal TRK2 with the high value. Therefore, after the tracked access delay with respect to the rising edge of the internal clock with track signal CKP_TRK, the reset signal RST is pulled down, i.e. asserted, by the OR gate OR1.

In some embodiments, the global bit line reset tracking circuit 126 is configured to receive the internal clock with track signal CKP_TRK, track a first RC delay for the global bit line pair (e.g. GBL5 and GBLB5) to be pre-charged, and a second RC delay for the global bit line reset signal GRST to be propagated throughout the global bit line reset line GRSTL upon receiving the falling edge of the internal clock with track signal CKP_TRK, and assert the track signal TRK1 when the later of the first RC delay and the second RC delay is reached. Details of the global bit line reset tracking circuit 126 are provided below with reference to FIG. 10. Therefore, after the longer of the tracked first RC delay and second RC delay with respect to the falling edge of the internal clock with track signal CKP_TRK, the reset signal RST is pulled up, i.e. deasserted, by the OR gate OR1.

Figure 10:
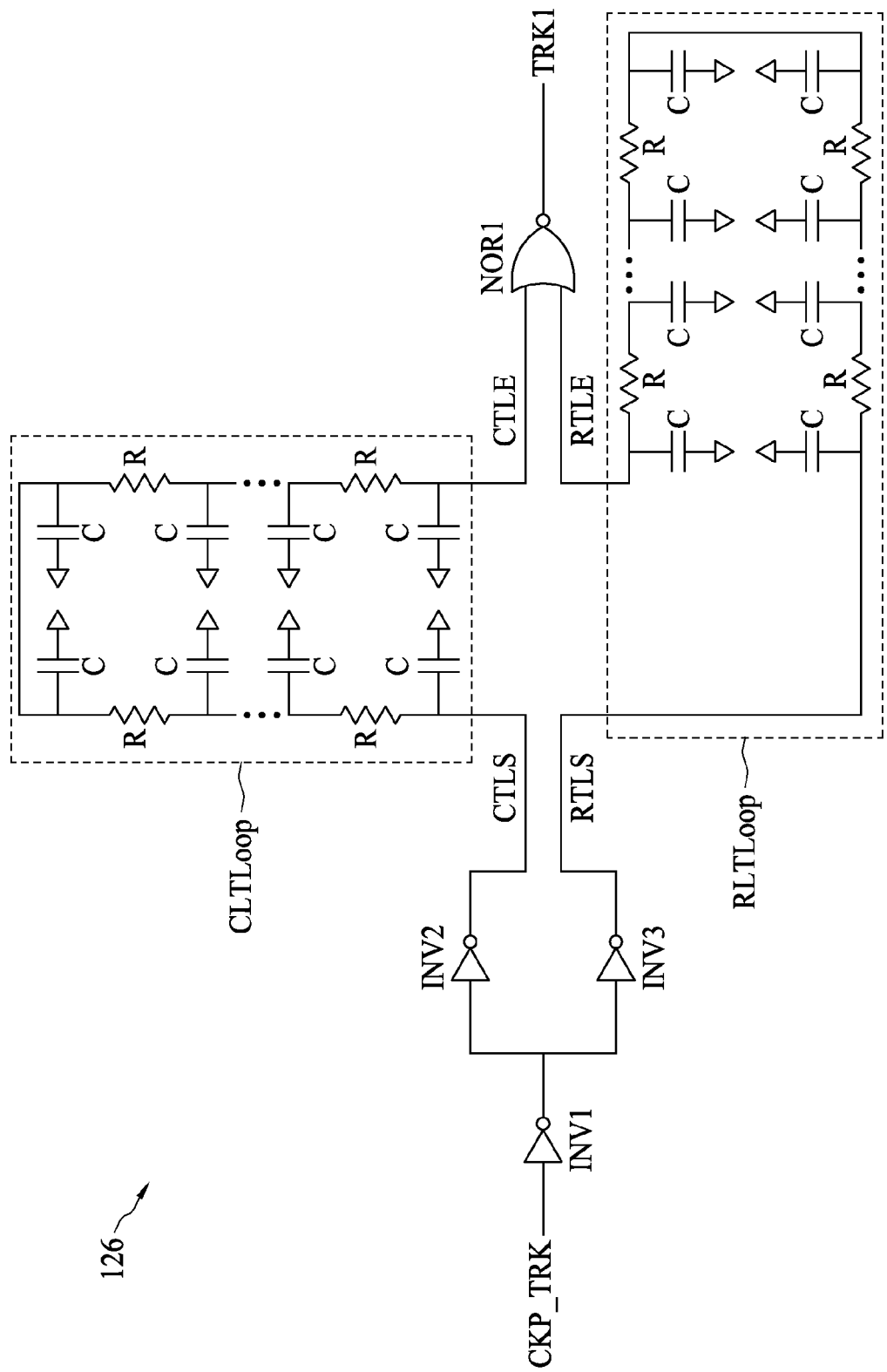
FIG. 10 is a schematic circuit diagram of the global bit line reset tracking circuit in accordance with some embodiments.

FIG. 10 is a schematic circuit diagram of the global bit line reset tracking circuit 126 in accordance with some embodiments. The global bit line reset tracking circuit 126 includes inverters INV1, INV2 and INV3, the column line tracking loop CLTLoop, the row line tracking loop RLTLoop, an NOR gate NOR1. The inverter INV receives the internal clock with track signal CKP_TRK at its input, and is coupled to inputs of the inverters INV2 and INV3 at its output. An output of the inverter INV2 is coupled to the starting end CTLS of the column line tracking loop CLTLoop. An output of the inverter INV3 is coupled to the starting end RTLS of the row line tracking loop RLTLoop. The ending end CTLE of the column line tracking loop CLTLoop and the ending end RTLE of the row line tracking loop RLTLoop are coupled to a first input and a second input of the NOR gate NOR1, respectively. An output of the NOR gate NOR1 generates the track signal TRK1 of the global bitline reset tracking circuit 126.

When the falling edge of the internal clock with track signal CKP_TRK arrives, it propagates along a first tracking path through the inverters INV1 and INV2, the column line tracking loop CLTLoop to the first input of the NOR gate NOR1 and a second tracking path through the inverters INV1 and INV3, the row line tracking loop RLTLoop to the second input of the NOR gate NOR1. When both the first input and the second input of the NOR gate NOR1 receive the propagated falling edge of the internal clock with track signal CKP_TRK through the first tracking path and the second tracking path, respectively, the NOR gate NOR1 asserts its output with the high value.

As shown in FIG. 10, the column line tracking loop CLTLoop and the row line tracking loop RLTLoop are made of conductive lines that can be represented by RC networks shown in FIG. 10. In this manner, the effect of temperature on the first RC delay for the global bit line pair (e.g. GBL5 and GBLB5) to be pre-charged, and on the second RC delay for the global bit line reset signal GRST to propagate throughout the global bit line rest line GRSTL is captured by the column line tracking loop CLTLoop and the row line tracking loop RLTLoop.

Figure 11:
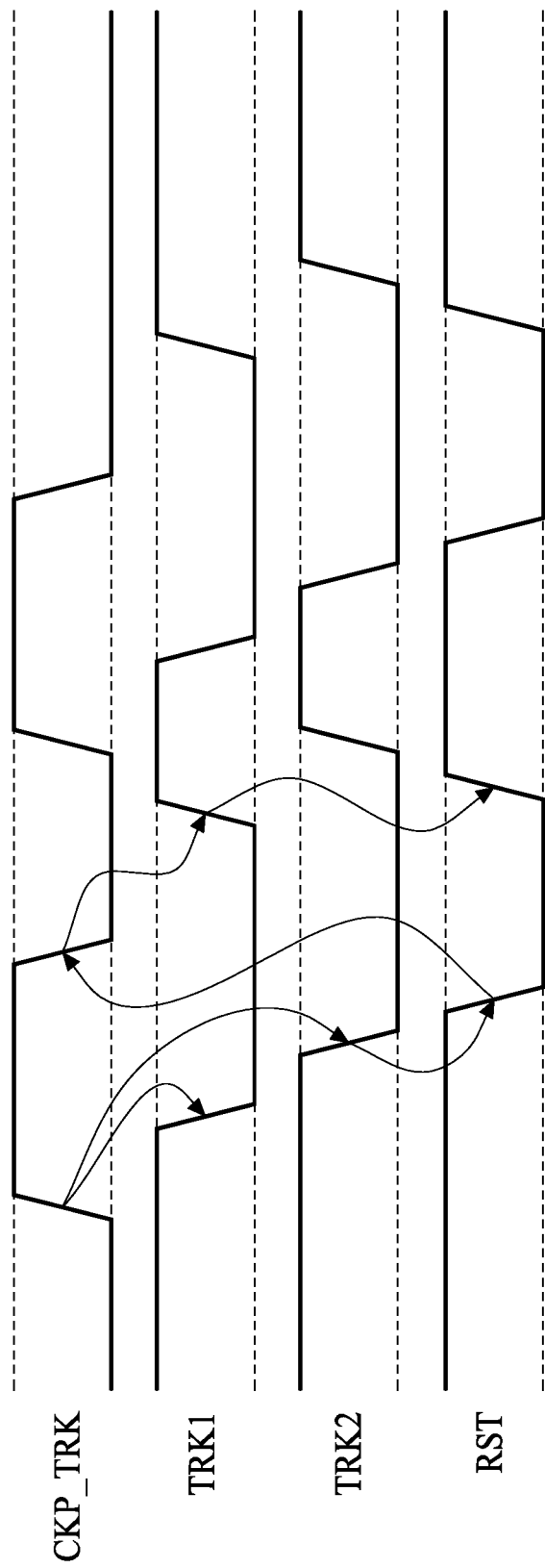
FIG. 11 is a schematic timing diagram for generating the reset signal based on the track signals in accordance with some embodiments.

FIG. 11 is a schematic timing diagram for generating the reset signal RST based on the track signals TRK1 and TRK2 in accordance with some embodiments. A rising edge of the internal clock with track signal CKP_TRK triggers the global bit line reset tracking circuit 126 to generate a falling edge of the track signal TRK1 and the series-connected wordline tracking circuit 120 and bit line tracking circuit 122 to generate a falling edge of the tracking signal TRK2, which in turn causes the OR gate OR1 to assert the reset signal RST with a low value. The falling edge of the reset signal RST causes a falling edge of the internal clock with track signal CKP_TRK to arrive. The falling edge of the internal clock with track signal CKP_TRK triggers the global bit line reset tracking circuit 126 to generate a rising edge of the track signal TRK which in turn causes the OR gate OR1 to deassert the reset signal RST with a high value.

Figure 12:
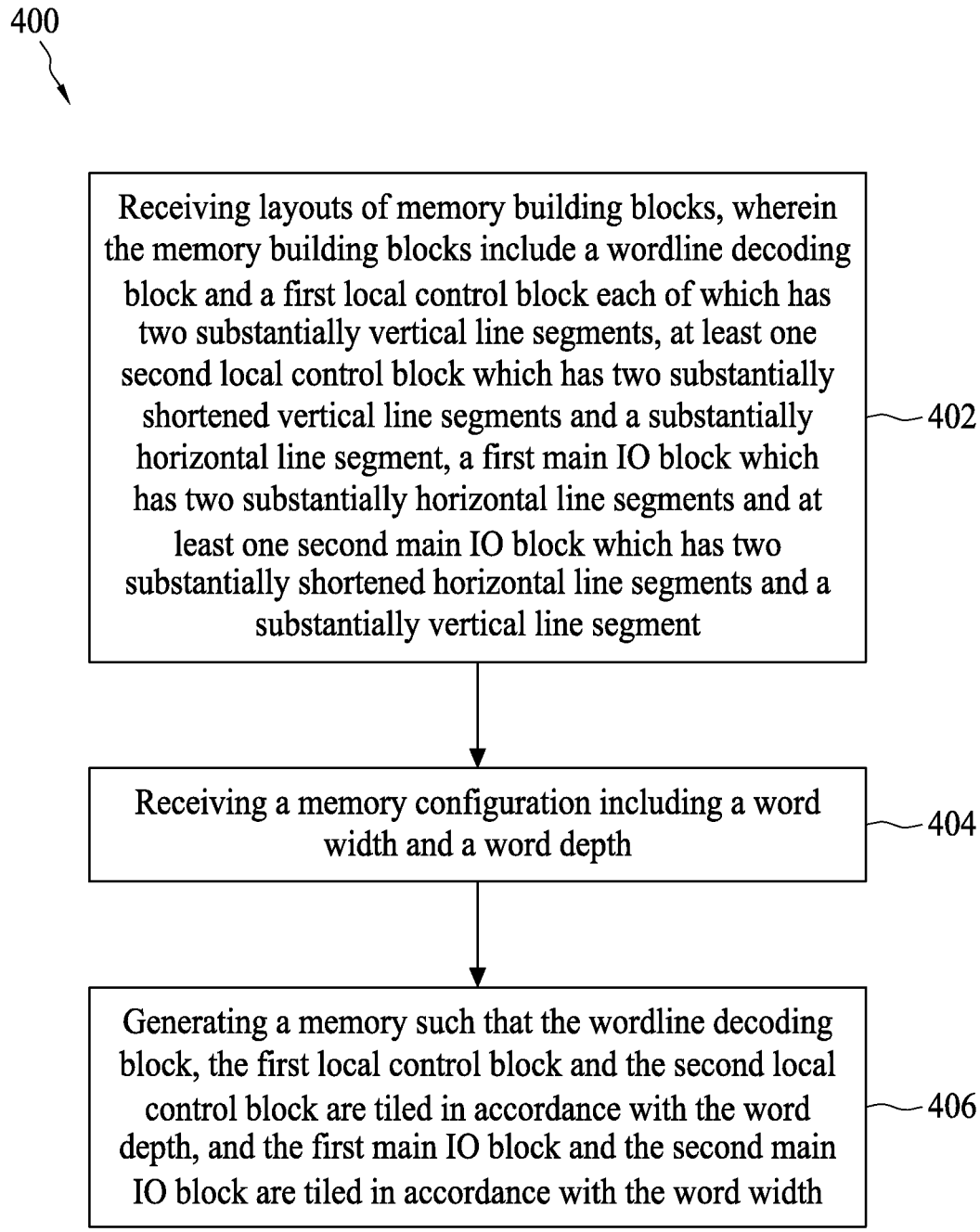
FIG. 12 is a flow diagram of a method for compiling an SP memory in FIG. 14 in accordance with some embodiments.
Figure 14:
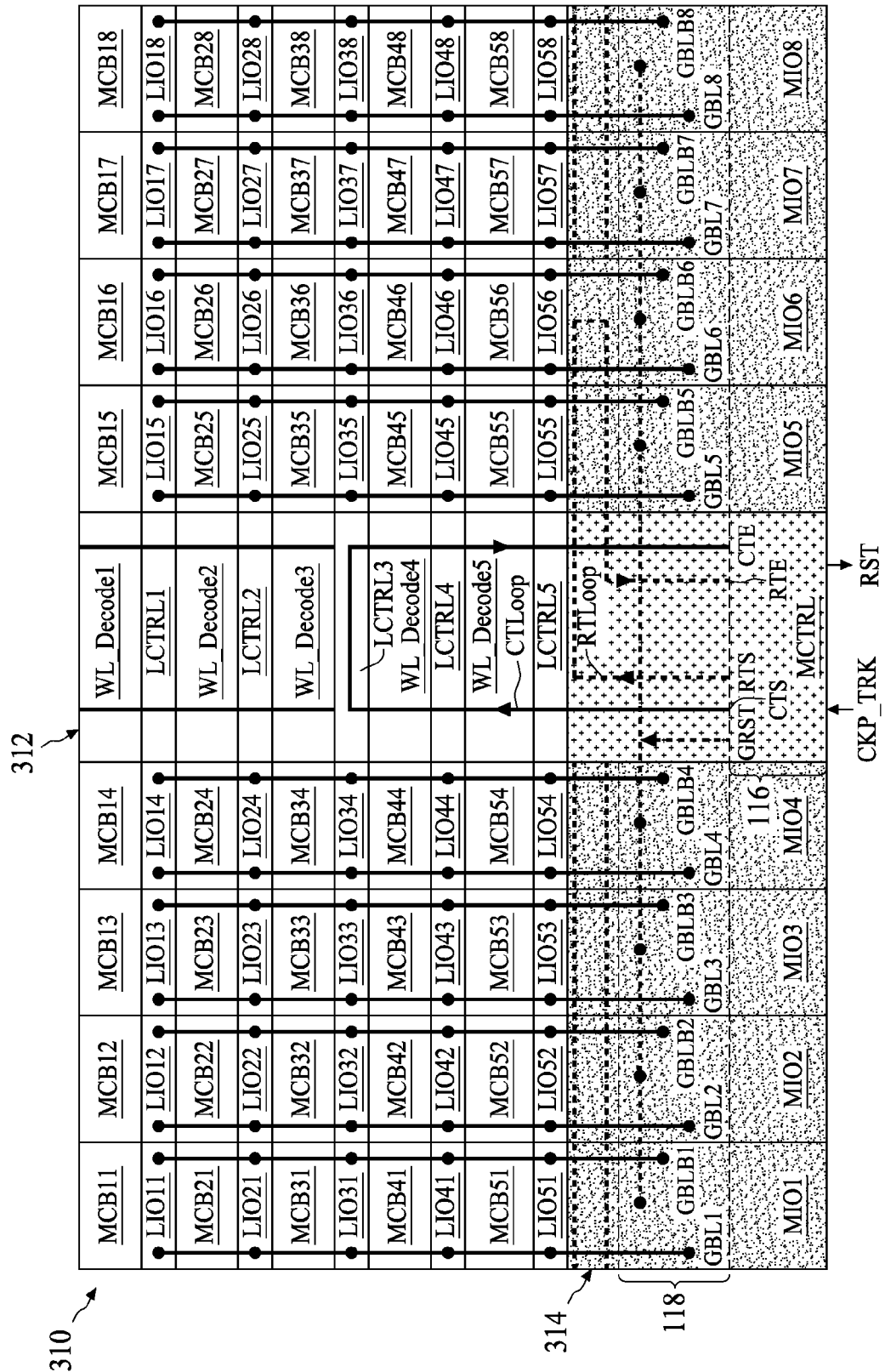
FIG. 14 is a schematic block diagram of the SP memory in accordance with other embodiments.

FIG. 12 is a flow diagram of a method 400 for compiling an SP memory 310 in FIG. 14 in accordance with some embodiments. In operation 402, layouts of memory building blocks are received. The memory building blocks include a wordline decoding block and a first local control block each of which has two substantially vertical line segments, at least one second local control block which has two substantially shortened vertical line segments and a substantially horizontal line segment, a first main IO block which has two substantially horizontal line segments and at least one second main IO block which has two substantially shortened horizontal line segments and a substantially vertical line segment. In operation 404, a memory configuration including a word width and a word depth is received. In operation 406, a memory is generated such that the wordline decoding block, the first local control block and the second local control block are tiled in accordance with the word depth, and the first main IO block and the second main IO block are tiled in accordance with the word width.

Figure 13:
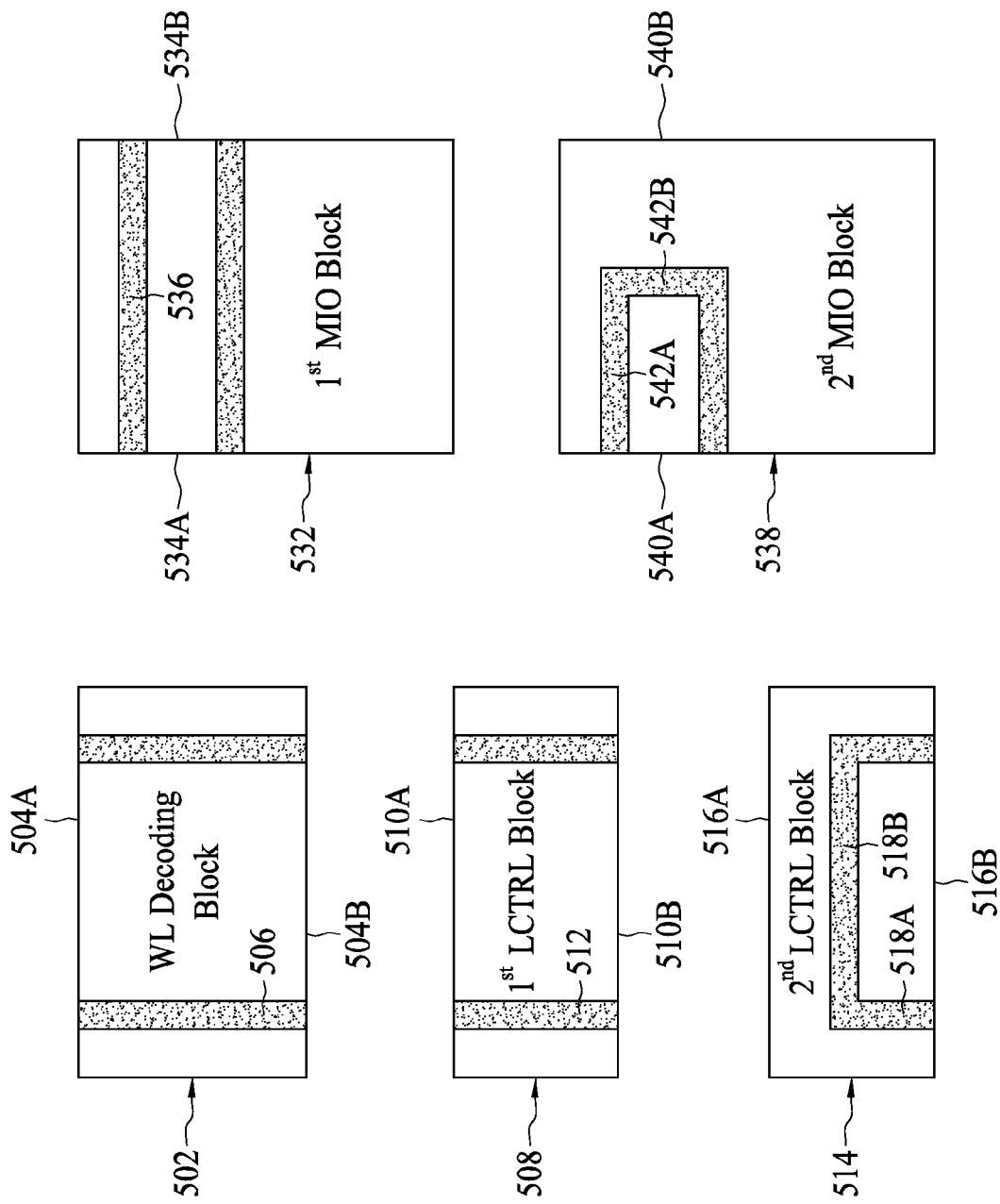
FIG. 13 is a diagram including simplified layouts of the memory building blocks in accordance with some embodiments.

FIG. 13 is a diagram including simplified layouts of the memory building blocks 502, 508, 514, 532 and 538 in accordance with some embodiments. In operation 402, the layouts of the memory building blocks 502, 508, 514, 532 and 538 are received. The memory building blocks include a word line decoding block 502, a first local control block 508, a second local control block 514, a first main IO block 532 and the second main 10 block 538. Other memory building blocks such as the memory bank, the local IO block, the main control block are not shown for simplicity. The wordline decoding block 502 has two substantially vertical line segments 506 running through horizontal borders 504A and 504B of the block 502. The first local control block 508 has two substantially vertical line segments 512 running through horizontal borders 510A and 510B of the block 508. The second local control block 514 has two substantially shortened vertical line segments 518A that reaches a horizontal border 516B but does not reach a horizontal border 516A of the block 514 and a substantially horizontal line segment 518B forming an inverted U-shape with the shortened vertical line segments 518A. The first main IO block 532 has two substantially horizontal line segments 536 running through vertical borders 534A and 534B of the block 532. The second main IO block 538 has two substantially shortened horizontal line segments 542A that reaches a vertical border 540A but does not reach a vertical border 540B of the block 538, and a substantially vertical line segment 542B forming a rotated U-shape with the shortened horizontal line segments 542A.

FIG. 14 is a schematic block diagram of the SP memory 110 in accordance with other embodiments. Referring to FIGS. 13 and 14, in operation 404, the memory configuration including the number of rows and the number of columns, or equivalently the word depth and the word width, is received. In operation 406, the SP memory 310 is generated such that the wordline decoding block 502, the first local control block 508 and the second local control block 514 are tiled to form the accessing control column 312, and the first main IO block 532 and the second main IO block 538 are tiled to form the accessing control row 314. The wordline decoding block 502 is used as the wordline decoding blocks WL_Decode1, . . . and WL_Decode5. The first local control block 508 is used as the local control blocks LCTRL1, LCTRL2, LCTRL4 and LCTRL5. The second local control block 514 is used as the local control block LCTRL3. The numbers of main control blocks 502 and the first local control blocks 508 are dependent on the number of rows of memory banks MCB11, . . . and MCB18, . . . and MCB51, . . . and MCB58 which in turn depends on the word depth specified. The position where the second local control block 514 is used instead of the first local control block 508 is also dependent on the word depth. The first main IO block 532 is used as the main IO blocks MIO1 to MIO5, and MIO7 to MIO8. The second main IO block 528 is used as the main IO block MIO6. The number of first main IO blocks 532 is dependent on the number of columns of memory banks MCB11, . . . and MCB51, . . . and MCB18, . . . and MCB58 which in turn depends on the word width specified. The position where the second main IO block 538 is used instead of the first main IO block 532 is also dependent on the word width.

Therefore, the column line tracking loop CLTLoop in the accessing control column 312 and the row line tracking loop RLTLoop in the accessing control row 314 are configurable with respect to different word depth, and word width, respectively. Compared to the logic delay generated by logic gates which is fixed with respect to different word depths and word width, the RC delay generated by the column line tracking loop CLTLoop or the row line tracking loop RLTLoop changes with word depth or word width when the memory 310 is being compiled. Hence, performance of TDM DP memories 100 of the different sizes can be specifically optimized.

Furthermore, compared to the SP memory 110 in FIG. 2, each of the word line decoding blocks WL_Decode1, ... and WL_Decode5 and the local control blocks LCTRL1, ... and LCTRL5 except for the local control block LCTRL3 in FIG. 13 contains two substantially vertical line segments 506 or 512 running through the block. Only the local control block LCTRL3 contains the two substantially shortened vertical line segments 518A that are linked by the substantially horizontal line segment 518B. Each of the main IO blocks MIO1, ... and MIO8 except for the main IO block MIO6 contains two substantially horizontal line segments 536 running through the block. Only the main IO block MIO6 contains two substantially shortened horizontal line segments 542A that are linked by the substantially vertical line segment 542B. Therefore, when an accessing control column 312 of the SP memory 110 is being compiled, the blocks for each of the five rows of the SP memory 310 are the same, except for the local control block (e.g. LCTRL3) for one of the rows. When an accessing control row 314 of the SP memory 110 is being compiled, the blocks for each of the eight columns of the SP memory 310 are the same, except for the main 10 block (e.g. MIO6) for one of the columns.

A method that generates the SP memory 110 in FIG. 2 and thereby employs memory building blocks that do not contain the line segments is within the contemplated scope of the present disclosure.

Figure 15:
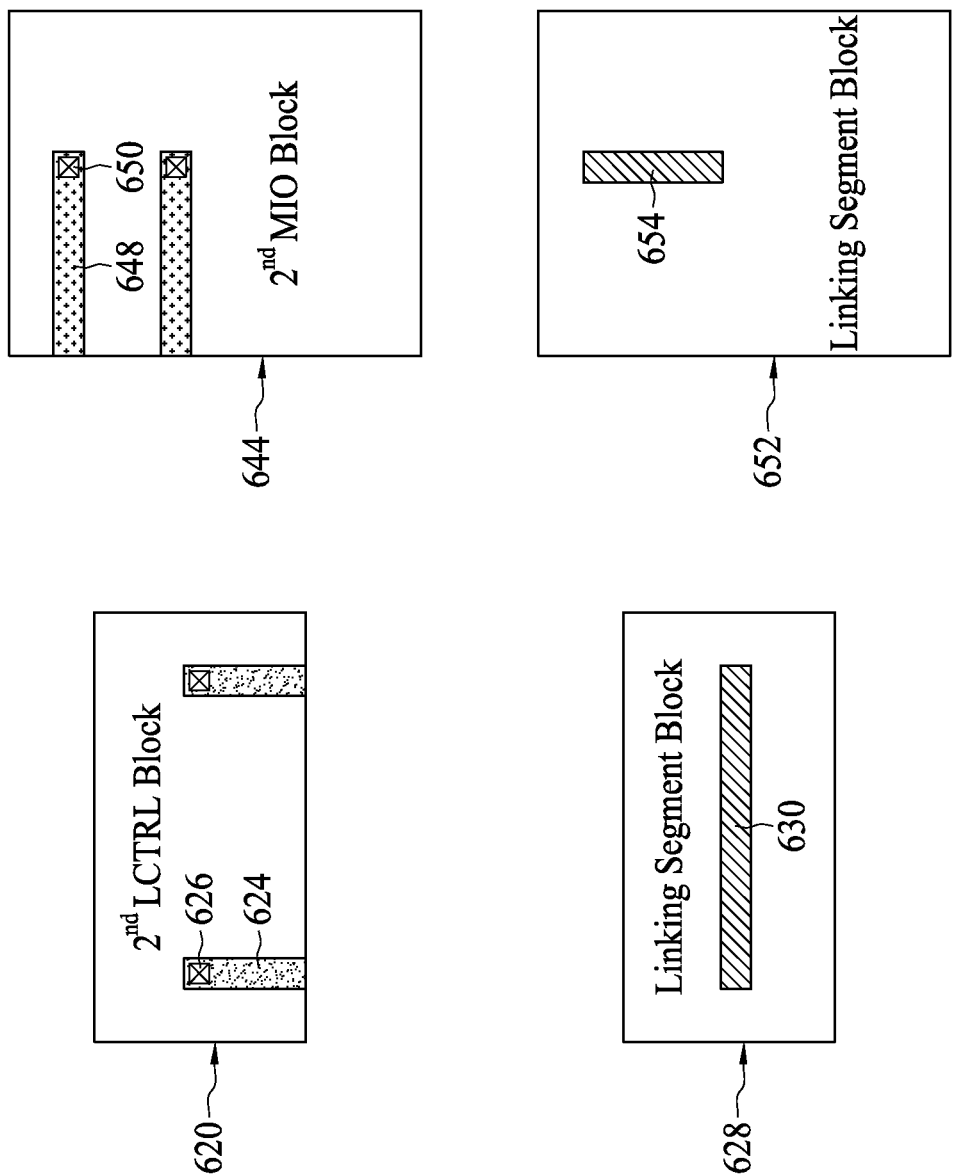
FIG. 15 is a diagram including simplified layouts of a second local control block, second main 10 block and associated linking segment blocks in accordance with other embodiments.

FIG. 15 is a diagram including simplified layouts of a second local control block 620, second main 10 block 644 and associated linking segment blocks 624 and 652 in accordance with other embodiments. Compared to the second local control block 514 in FIG. 13, the second local control block 620 has two substantially shortened vertical line segments 624 and vias 626 disposed on the line segments 624 for connecting the line segments 624 to a substantially horizontal line segment 630 in a linking line segment block 628 that overlaps with the second local control block 620. Therefore, the line segments 624 and the line segment 630 are in different metal layers. In addition, compared to the second main 10 block 538 in FIG. 13, the second main 10 block 644 has two substantially shortened horizontal line segments 648 and vias 650 disposed on the line segments 648 for connecting the line segments 648 to a substantially vertical line segment 654 in a linking line segment block 652 that overlaps with the second main 10 block 644. Hence, the line segments 648 and the line segment 654 are in different metal layers.

Figure 16:
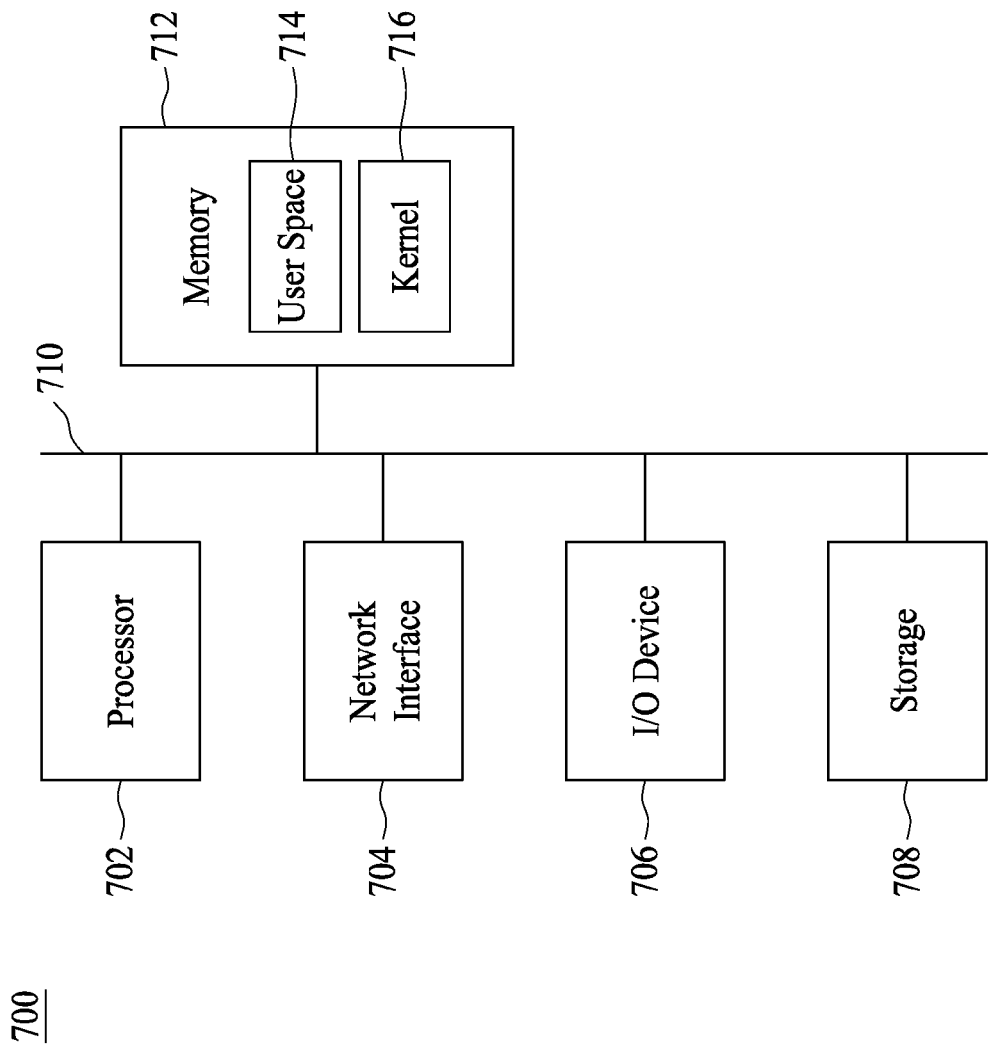
FIG. 16 is a block diagram of a hardware system for implementing the method embodiments described with references to FIGS. 12 to 15 in accordance with some embodiments.

FIG. 16 is a block diagram of a hardware system 700 for implementing the method embodiments described with references to FIGS. 12 to 15 in accordance with some embodiments. The system 700 includes at least one processor 702, a network interface 704, an input and output (I/O) device 706, a storage 708, a memory 712, and a bus 710. The bus 710 couples the network interface 704, the I/O device 706, the storage 708 and the memory 712 to the processor 702.

In some embodiments, the memory 712 comprises a random access memory (RAM) and/or other volatile storage device and/or read only memory (ROM) and/or other non-volatile storage device. The memory 712 includes a kernel 716 and user space 714, configured to store program instructions to be executed by the processor 702 and data accessed by the program instructions.

In some embodiments, the network interface 704 is configured to access program instructions and data accessed by the program instructions stored remotely through a network. The I/O device 706 includes an input device and an output device configured for enabling user interaction with the system 700. The input device comprises, for example, a keyboard, a mouse, etc. The output device comprises, for example, a display, a printer, etc. The storage device 708 is configured for storing program instructions and data accessed by the program instructions. The storage device 708 comprises, for example, a magnetic disk and an optical disk.

In some embodiments, when executing the program instructions, the processor 702 is configured to perform the method described with reference to FIGS. 11-14.

In some embodiments, the program instructions are stored in a non-transitory computer readable recording medium such as one or more optical disks, hard disks and non-volatile memory devices.

Some embodiments have one or a combination of the following features and/or advantages. In some embodiments, a TDM DP memory includes a plurality of memory banks arranged in rows and columns, a column line tracking loop that traverse at least a portion of the rows, and/or a row line tracking loop that traverses at least a portion of the plurality of columns, and a tracking circuit configured to receive a first edge of a first signal, cause the first edge to be propagated through the column line tracking loop and/or the row line tracking loop, and cause a second edge of the first signal to be generated when receiving the propagated first edge of the first signal. The column line tracking loop and/or the row line tracking loop track RC delay for global bit line pairs to be reset and/or RC delay for a global bit line reset line to propagate a signal, respectively. Therefore, when the RC delay changes with the temperature, the column line tracking loop or the row line tracking loop accurately tracks the changes. Furthermore, the column line tracking loop and the row line tracking loop are constructed by tiling memory building blocks that contain line segments in accordance with a desired word width and word depth. Therefore, the difference in the RC delays for the memories of different sizes is accounted for. By more accurately tracking the RC delays, a guard band between a first pulse and second pulse in an internal clock signal is more tightly controlled, thereby improving performance of the TDM DP memory.

In some embodiments, a circuit comprises a plurality of memory banks, a column line tracking loop and/or a row line tracking loop, and a tracking circuit. The plurality of memory banks are arranged in a plurality of rows and a plurality of columns of memory building blocks. Each of the plurality of memory banks comprises at least one memory cell. The column line tracking loop has a first end and a second end and traverses at least a portion of the plurality of rows. The row line tracking loop has a first end and a second end and traverses at least a portion of the plurality of columns. The tracking circuit is configured to receive a first edge of a first signal, cause the first edge of a first signal to be propagated from the first end to the second end of the column line tracking loop and/or from the first end to the second end of the row line tracking loop and cause a second edge of the first signal when receiving the propagated first edge of the first signal. The first signal is associated with accessing of the plurality of memory banks.

In some embodiments, a circuit comprises a plurality of memory banks, at least a column line, a row line, a column line tracking loop and/or a row line tracking loop, and a tracking circuit. The plurality of memory banks are arranged in a plurality of rows and a plurality of columns of memory building blocks. Each of the plurality of memory banks comprises at least one memory cell. The at least one column line runs across the plurality of rows. The row line runs across the plurality of columns. The column line tracking loop has a first end and a second end and has portions that are substantially in parallel to at least a portion of the at least one column line. The row line tracking loop has a first end and a second end and has portions that are substantially in parallel to the row line. The tracking circuit is configured to receive a first edge of a first signal, cause the first edge of a first signal to be propagated from the first end to the second end of the column line tracking loop and/or from the first end to the second end of the row line tracking loop and cause a second edge of the first signal when receiving the propagated first edge of the first signal. The first signal is associated with accessing of the plurality of memory banks.

In some embodiments, in a method, layouts of memory building blocks are received by at least one processor. The memory building blocks comprise a plurality of first memory building block and at least one second memory building block. Each of the at least one first memory building clock has two substantially vertical line segments running from a first horizontal border to a second horizontal border of the first memory building block. Each of the second memory building blocks has two substantially shortened vertical line segments and a substantially horizontal line segment linking the two substantially shortened vertical line segment. A memory configuration comprising a memory size is received by the at least one processor. A memory with the number of rows is generated by the at least one processor using the memory building blocks. A number of first memory building blocks tiled in a first column of the memory and a location where the at least one second memory building block is inserted in the first column are determined based on the memory size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a plurality of memory banks arranged in a plurality of rows and a plurality of columns of memory building blocks, each of the plurality of memory banks comprising at least one memory cell,
        each memory cell of the plurality of memory banks being a single-port memory cell;
    a column line tracking loop that has a first end and a second end and traverses at least a portion of the plurality of rows, and/or a row line tracking loop that has a first end and a second end and traverses at least a portion of the plurality of columns; and
    a tracking circuit configured to receive a first edge of a first internal clock signal, cause the first edge of the first internal clock signal to be propagated from the first end to the second end of the column line tracking loop and/or from the first end to the second end of the row line tracking loop and cause a second edge of the first internal clock signal when receiving the propagated first edge of the first internal clock signal;
    a time division multiplexing (TDM) circuit coupled to the tracking circuit and configured to receive an external clock signal and generate the first internal clock signal that has at least a first pulse and a second pulse during a clock cycle of the external clock signal,
        the plurality of memory banks being accessed in response to the first internal clock signal.

2. The circuit of claim 1, wherein the first edge of the first internal clock signal is an ending edge of the first pulse, and the second edge of the first internal clock signal is a starting edge of the second pulse.

3. The circuit of claim 1, wherein the first internal clock signal has the first pulse regardless whether the plurality of memory banks are to be accessed in the first pulse.

4. The circuit of claim 1, wherein a first column in the plurality of columns comprises:
    at least a first memory building block each of which has two substantially vertical line segments running from a first horizontal border to a second horizontal border of the first memory building block; and
    at least a second memory building block which has two substantially shortened vertical line segments and a substantially horizontal line segment linking the two substantially shortened vertical line segments; and
        the line segments in the first column forming the column line tracking loop.

5. The circuit of claim 1, wherein a first row in the plurality of rows comprises:
    at least a first memory building block each of which has two substantially horizontal line segments running from a first vertical border to a second vertical border of the first memory building block;
    at least a second memory building block which has two substantially shortened horizontal line segments and a substantially vertical line segment linking the two substantially shortened horizontal line segments; and
        the line segments in the first row forming the row line tracking loop.

6. The circuit of claim 1, further comprising:
    an accessing control column and an accessing control row in the plurality of rows and the plurality of columns configured to control accessing of the plurality of memory banks;
    the column line tracking loop being configured within the accessing control column, and/or the row line tracking loop being configured within the accessing control row.

7. A circuit, comprising:
    a plurality of memory banks arranged in a plurality of rows and a plurality of columns of memory building blocks, each of the plurality of memory banks comprising at least one memory cell;
    a column line tracking loop that has a first end and a second end and traverses at least a portion of the plurality of rows, and/or a row line tracking loop that has a first end and a second end and traverses at least a portion of the plurality of columns; and a tracking circuit configured to receive a first edge of a first signal, cause the first edge of the first signal to be propagated from the first end to the second end of the column line tracking loop and/or from the first end to the second end of the row line tracking loop and cause a second edge of the first signal when receiving the propagated first edge of the first signal, the first signal being associated with accessing of the plurality of memory banks; and wherein a first column in the plurality of columns comprises:

at least a first memory building block each of which has two substantially vertical first line segments running from a first horizontal border to a second horizontal border of the first memory building block; and at least a second memory building block which has two substantially shortened vertical second line segments and a substantially horizontal third line segment linking the two second line segments; and the first line segments, the second line segments and the third line segment in the first column forming the column line tracking loop; and/or a first row in the plurality of rows comprises:

at least a third memory building block each of which has two substantially horizontal fourth line segments running from a first vertical border to a second vertical border of the third memory building block;

at least a fourth memory building block which has two substantially shortened horizontal fifth line segments and a substantially vertical sixth line segment linking the two fifth line segments; and the fourth line segments, the fifth line segments and the sixth line segment in the first row forming the row line tracking loop.

8. The circuit of claim 7, further comprising:

a time division multiplexing (TDM) circuit coupled to the tracking unit and configured to receive an external clock signal and generate a first internal clock signal that has at least a first pulse and a second pulse during a clock cycle of the external clock signal, wherein each memory cell of the plurality of memory banks is a single-port memory cell;

the plurality of memory banks are accessed in response to the first internal clock signal; and the first signal is the first internal clock signal.

9. The circuit of claim 8, wherein the first edge of the first signal is an ending edge of the first pulse, and the second edge of the first signal is a starting edge of the second pulse.

10. The circuit of claim 8, wherein the first internal clock signal has the first pulse regardless whether the plurality of memory banks are to be accessed in the first pulse.

11. The circuit of claim 7, further comprising:

an accessing control column and an accessing control row in the plurality of rows and the plurality of columns configured to control accessing of the plurality of memory banks;

the column line tracking loop being configured within the accessing control column, and/or the row line tracking loop being configured within the accessing control row.

* * * * *